(12) United States Patent
Chien

(10) Patent No.: US 6,958,633 B2
(45) Date of Patent: Oct. 25, 2005

(54) METHOD AND RELATED APPARATUS FOR NON-INTEGER FREQUENCY DIVISION

(75) Inventor: Hsiuan-Hau Chien, Taipei (TW)

(73) Assignee: ALI Corporation, Taipei (TW)

( * ) Notice: Subject to any disclaimer, the term of this patent is extended or adjusted under 35 U.S.C. 154(b) by 0 days.

(21) Appl. No.: 10/707,514

(22) Filed: Dec. 19, 2003

(65) Prior Publication Data
US 2005/0077931 A1   Apr. 14, 2005

(30) Foreign Application Priority Data
Oct. 8, 2003 (TW) .............................. 92127998 A

(51) Int. Cl.⁷ .......................................... H03K 21/00
(52) U.S. Cl. ...................................... 327/115; 377/48
(58) Field of Search ............. 327/115, 117; 377/47–48

(56) References Cited

U.S. PATENT DOCUMENTS

| | | | | |
|---|---|---|---|---|
| 3,571,728 A | * | 3/1971 | Andrea et al. ................. 377/48 |
| 4,866,741 A | * | 9/1989 | Minuhin ........................ 377/48 |
| 5,335,253 A | * | 8/1994 | Oliver et al. .................. 377/48 |
| 6,157,694 A | * | 12/2000 | Larsson ........................ 377/48 |
| 6,356,123 B1 | * | 3/2002 | Lee et al. ..................... 327/115 |
| 6,542,013 B1 | * | 4/2003 | Volk et al. ................... 327/115 |
| 6,707,327 B2 | * | 3/2004 | Choi et al. ................... 327/115 |

* cited by examiner

Primary Examiner—Timothy P. Callahan
Assistant Examiner—Cassandra Cox
(74) Attorney, Agent, or Firm—Winston Hsu

(57) ABSTRACT

A method includes generating N reference clocks with period T and phases uniformly distributed in 360 degrees; using each of the N reference clocks to trigger M intermediate signals with period M*T and phases uniformly distributed in 360 degrees; and performing a logic operation between at least two intermediate signals respectively corresponding to two different reference clocks to generate an output clock with period (M/N)*T to achieve non-integer frequency division.

14 Claims, 25 Drawing Sheets

METHOD AND RELATED APPARATUS FOR NON-INTEGER FREQUENCY DIVISION

BACKGROUND OF INVENTION

1. Field of the Invention

The present invention relates to a method and related apparatus for performing frequency division, and more particularly, to a method and related apparatus for performing non-integer frequency division and for simplifying a logic circuit.

2. Description of the Prior Art

In modern information society, files, statistics, and video data can be speedily transmitted, processed, and stored by electronic signals. Electronic circuits (especially digital electronic circuits) for processing electronic signals become an important base of hardware. In an electronic circuit, it is necessary to integrate many circuits with different functions. In order to coordinate the operations of different circuits, each circuit must be triggered by a steady clock. Due to the complexity of electronic systems, this requires clocks with different frequencies to trigger different circuits. For instance, in a microprocessor, operational circuits for processing data and memory circuits for storing data work under clocks with different frequencies, and require triggering by clocks with different frequencies. Therefore manufactures design electronic circuits for the requirements of multiple-clock systems.

Please refer to FIG. 1. FIG. 1 shows functions of a typical phase-locked circuit 10. The phase-locked circuit 10 generates an output clock CPo1 according to a standard clock CPr for triggering other circuits. The phase-locked circuit 10 comprises a phase/frequency difference detector 14, a low-pass filter 16, a voltage-controlled oscillator 18, a 1/Np frequency dividor 12A, and a 1/Mp frequency dividor 12B. The standard clock CPr divided by the frequency dividor 12A becomes a clock CPa, the period of CPa being Np times the period of CPr. In the same way, the output clock CPo1 from the voltage-controlled oscillator 18 divided by the frequency dividor 12B becomes a clock CPb, the period of CPb being Mp times the period of CPo1. The detector 14 detects the phase/frequency difference between CPa and CPb, and inputs the result into the filter 16. According to the result, the filter 16 generates the corresponding control voltage Vcp for controlling the voltage control oscillator 18 to regulate the frequency of Cpo1. Since the clock CPb changes with CPo1, the phase/frequency difference between clock CPa and regulated clock CPb is detected again by the detector 14. As the loop among the detector 14, the filter 16, and the voltage-controlled oscillator 18 operate, the frequency/phase of CPb locked will be locked as the same as that of CPa. Then the clock CPo1 generated by the voltage-controlled oscillator 18 can be used to trigger other circuits (not shown in FIG. 1). Due to the operations of 12A and 12B, the period of CPo1 is (Np/Mp) times the period of the standard clock CPr.

Please refer to FIG. 2. FIG. 2 is an illustration of the voltage-controlled oscillator 18 in FIG. 1. The voltage-controlled oscillator 18 (also known as a chain oscillator) is formed by a plurality of differential inverters 20 connected together. As an example, the illustration in FIG. 2 only shows two inverters 20. In FIG. 2, the first inverter 20 outputs two clocks with opposite phases C2 and C4 and inputs them into the second inverter 20. The outputs C1 and C3 of the second inverter 20 are routed back to the first inverter 20. Please refer to FIG. 3 and FIG. 2. FIG. 3 shows timing states of C1 to C4 while the voltage-controlled oscillator 18 is working. The vertical axis shows wave amplitude and the horizontal axis shows time. As shown in FIG. 3, the clocks C1 and C3 with opposite phases rise from level L to level H and drop from level H to level L at tp0, respectively. After the first inverter receives the level adjustment of C1 and C3 at tp0, the first inverter will wait for a delay Td, and invert the outputs C2 and C4 to level L and level H at tp1, respectively. After the level adjustment of C2 and C4 at tp1 lasting for a delay Td, the level adjustment of C1 and C3 occurs at tp2. Repeated in the same way, four clocks C1 to C4 with the same period Tp will be formed, with Tp being four times the period of Td. The inverters 20 of the voltage-controlled oscillator 18 can receive a control voltage Vcp to change the delay Td for modifying the periods of C1 to C4. One of clocks C1 to C4 can be an output clock Cpo1 of the voltage control oscillator 18.

As shown in FIG. 3, the periods of C1 and C4 are the same as Tp, and the phases are different. Regarding the situation, please refer to FIG. 4. FIG. 4 shows, similar to FIG. 3, states of clocks C1 to C4. Clearly seen in FIG. 4, the phases of C1 to C4 are uniformly distributed over 360 degrees, that is to say, the phase difference is 90 degrees (a quarter of Tp). In other words, the oscillator 18 can generate many clocks with phases uniformly distributed in a period.

As mentioned above, electronic circuits require many different clocks to trigger different circuits. However, the phase-locked circuit 10 in FIG. 1 only can generate an output clock Cpo1 to trigger circuits. In the prior art, when many clocks with different frequencies (especially non-integer frequencies) are required, the required output clocks must be respectively generated by many phase-locked circuits. Regarding this situation, please refer to FIG. 5. FIG. 5 is a diagram of a prior art signal circuit 22 for generating two clocks CPo1 and CPo2. In order to generate two output clocks, the signal circuit 22 not only generates an output clock CPo1 by the phase-locked circuit 10 in FIG. 1, but also generates the other output clock CPo2 by another identical phase-locked circuit 24. As phase-locked circuits require analog circuits (such as filters and voltage-controlled oscillators), the layout of a phase-locked circuit is large. If a plurality of phase-locked circuits are used for generating many output clocks, the size of layout must be larger. This increases the cost, the size of layout, and power consumption.

SUMMARY OF INVENTION

It is therefore a primary objective of the claimed invention to provide a method and related apparatus for performing non-integer frequency division and for simplifying logic circuits to solve the above-mentioned problem. This can generate output clocks with non-integer frequency relation using clocks generated from a phase-locked circuit.

In the claimed invention, a voltage-controlled oscillator of phase-locked circuits generates N reference clocks with the same period T and phases uniformly distributed in one period. Each reference clock triggers a state machine respectively for generating M intermediate signals with period of M*T and phases uniformly distributed in M*T. In other words, the phase difference between the first intermediate signal triggered by the first reference clock and the m-th intermediate signal triggered by the n-th reference clock is equivalent to a time difference of $((n-1)/N+(m-1))*T$. The claimed invention makes use of these M*N intermediate signals to generate at least an output clock with period (M/N)*T by logic calculations to achieve non-integer frequency division. In other words, the claimed invention combines an output clock from a phase-locked circuit and at least an output clock with period (M/N)*T to have output clocks with different frequencies (especially non-integer frequencies) for a multiple-clock system to trigger circuits of different clocks.

In the claimed invention, as state machines and logic circuit modules of logic operations are digital devices, the size of layout for generating extra output clocks is smaller than that of a phase-locked circuit. This helps reduce the size of layout, power consumption, and cost.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
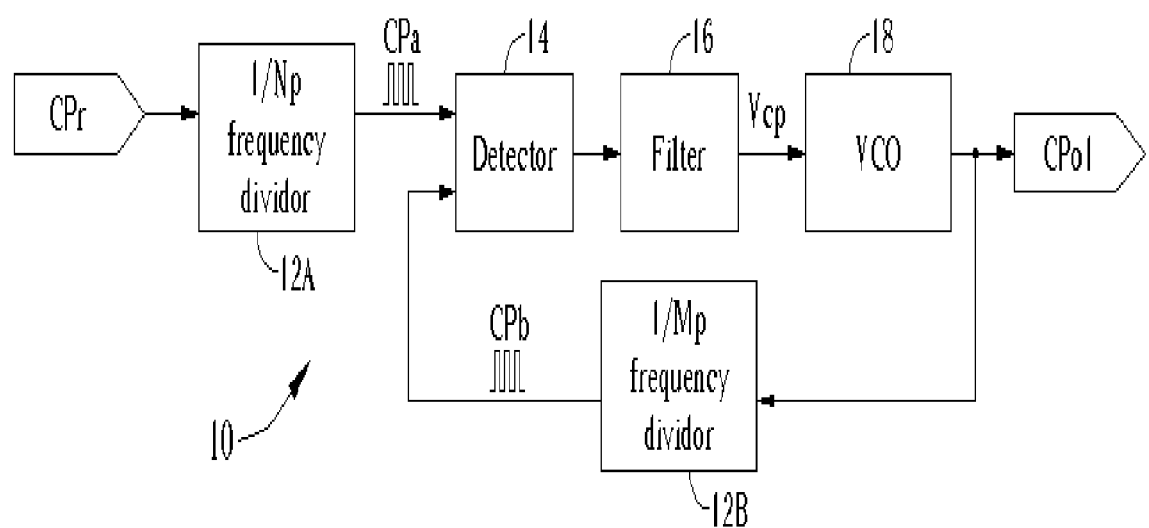
FIG. 1 shows a typical phase-locked circuit.
Figure 2:
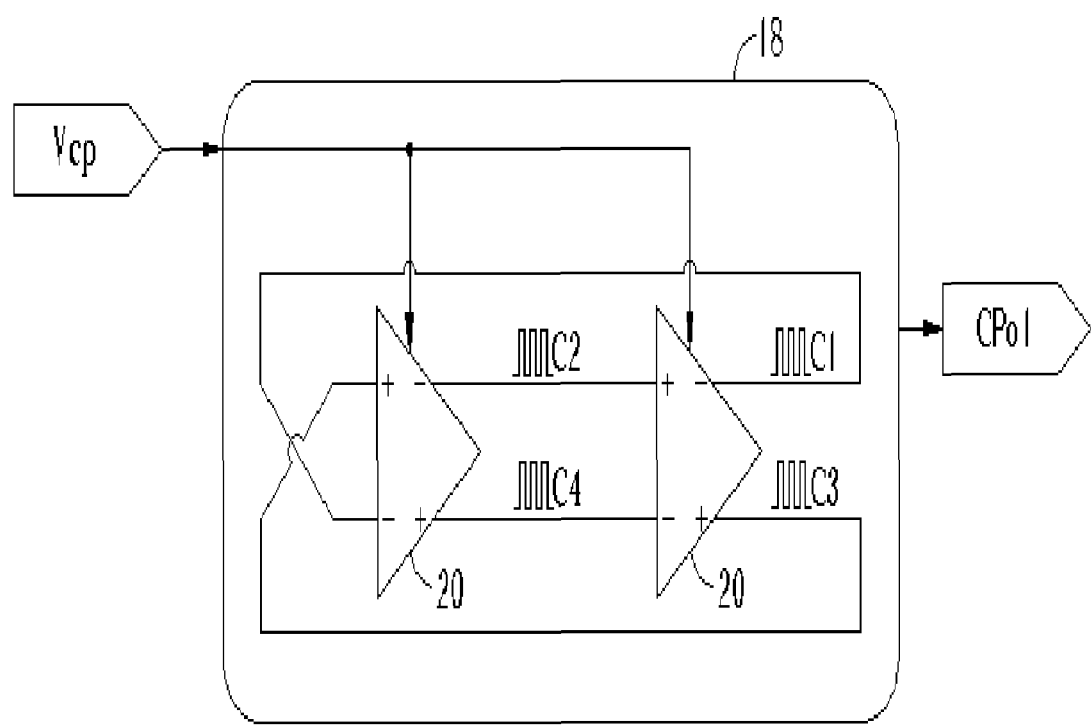
FIG. 2 is an illustration of the voltage-controlled oscillator in FIG. 1.
Figure 3:
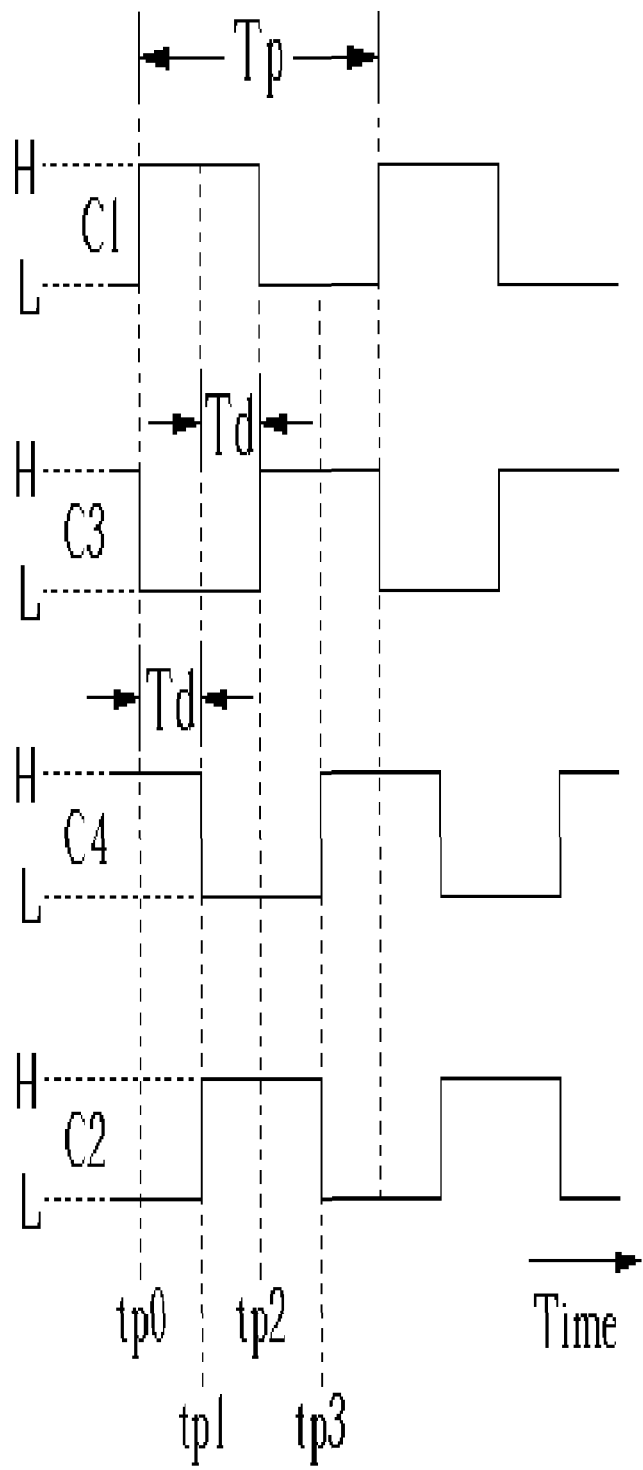
FIG. 3 and FIG. 4 show clock states related to the operation of a voltage-controlled oscillator.
Figure 4:
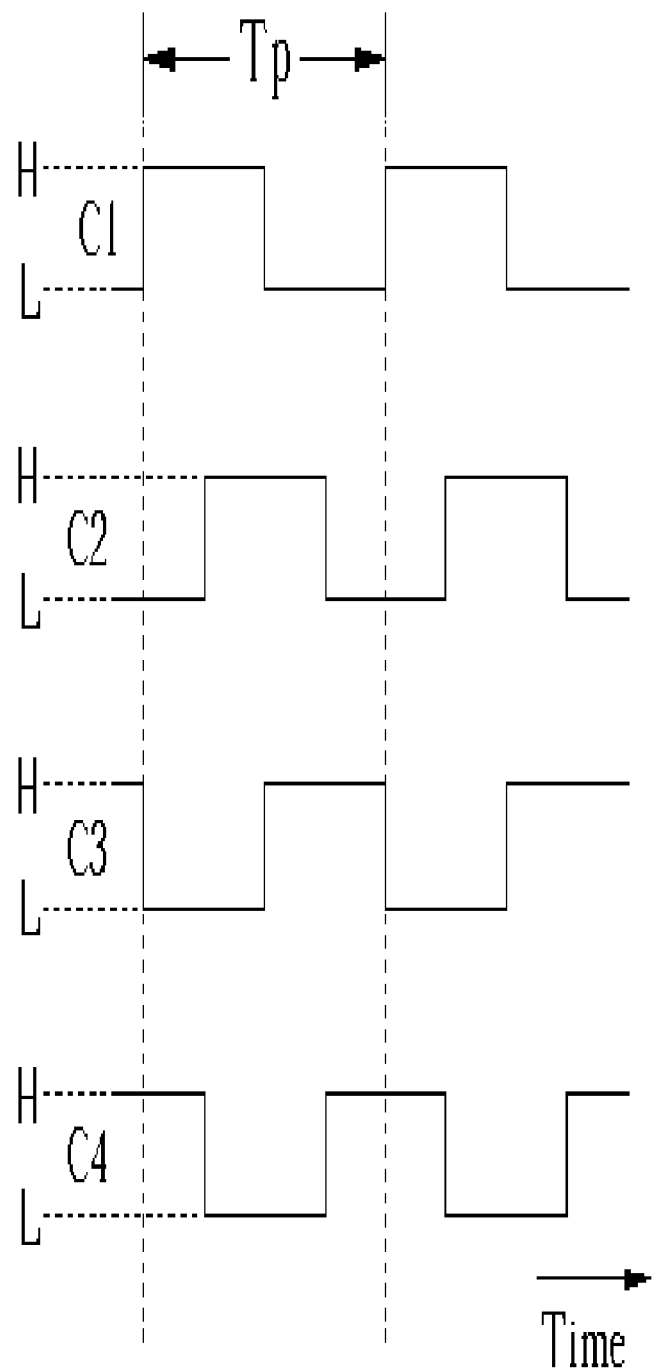
Figure 5:
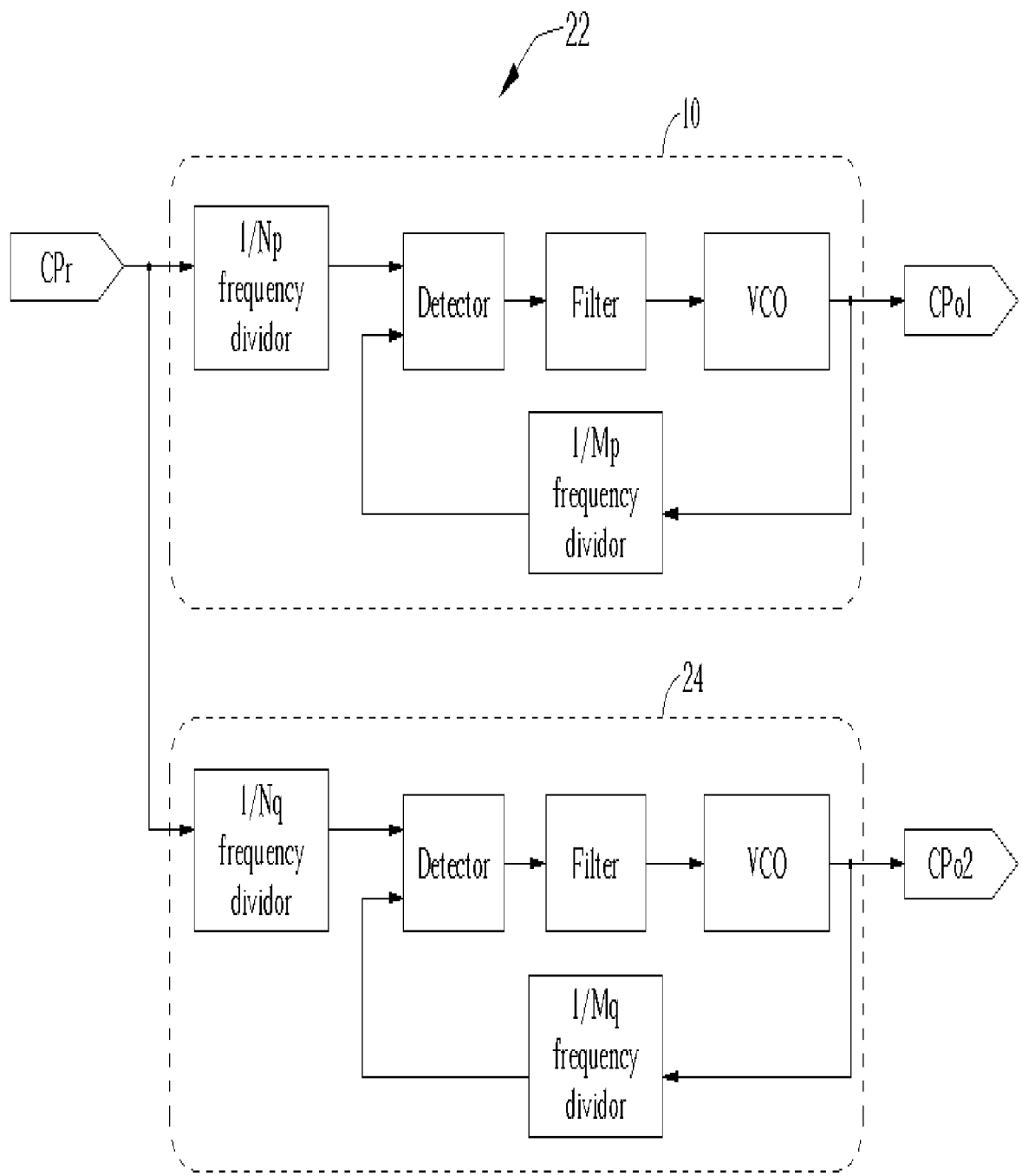
FIG. 5 is a diagram of a prior art signal circuit for generating many output clocks.
Figure 6:
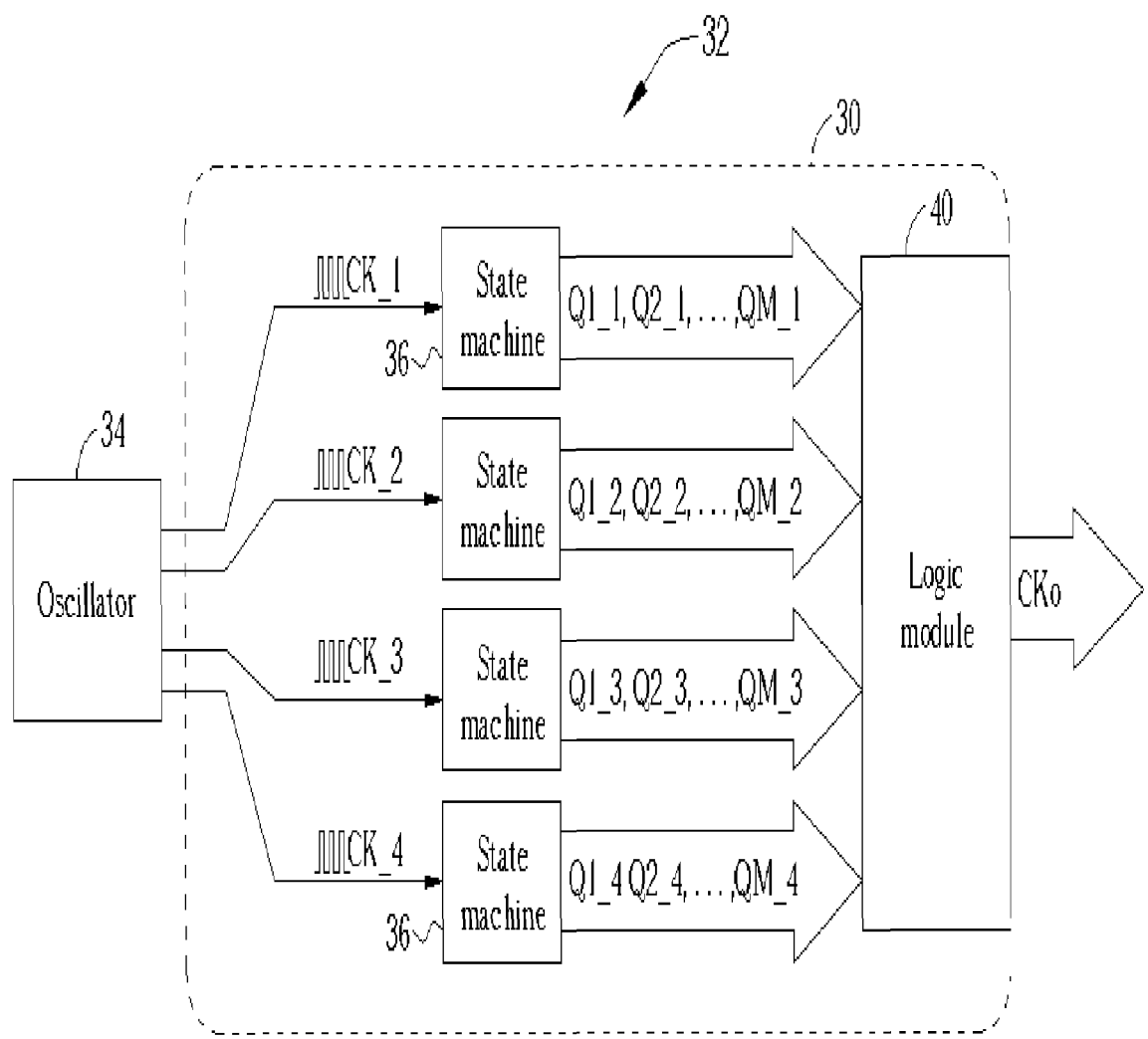
FIG. 6 is an embodiment according to the present invention.

In order to shed light on an embodiment according to the present invention, the following description first discusses an embodiment of a particular frequency division and then expands on the general applications. Please refer to FIG. 6. FIG. 6 is a diagram of a frequency division circuit 30 located in a signal circuit 32 for achieving M/4 frequency division (M is an integer) To achieve frequency division, besides the frequency division circuit 30, an oscillator is located in the signal circuit 32 for providing four clocks CK_1 to CK_4 as reference clocks. The period of each of the four clocks CK_1 to CK_4 is T, and the phases of the four clocks are uniformly distributed in 360 degrees. In other words, the phase difference between CK_n (n=1 to 4) and CK_1 is equivalent to the time difference of (n−1)*T/4. A general form of this equation is ((n−1)/N)*360 degrees, which expresses the phase difference between an n-th clock and the first clock when there are N clocks.

Corresponding to the four clocks CK_1 to CK_4, four state machines 36 are located in the frequency division circuit 30 in the present invention for forming a triggering module, each state machine 36 receiving a triggering clock for generating M intermediate signals with period M*T. As shown in FIG. 6, the first state machine 36 receives the triggering CK_1 for generating M intermediate signals Q1_1, Q2_1 to QM_1; the second state machine 36 receives the triggering CK_2 for generating M intermediate signals Q1_2, Q2_2 to QM_2, and so on. The M*N intermediate signals Qm_n (m=1 to M, n=1 to 4) are transmitted to a logic module 40 for logic operation, then at least a (M/4)*T clock is generated as an output clock Cko.

Figure 7:
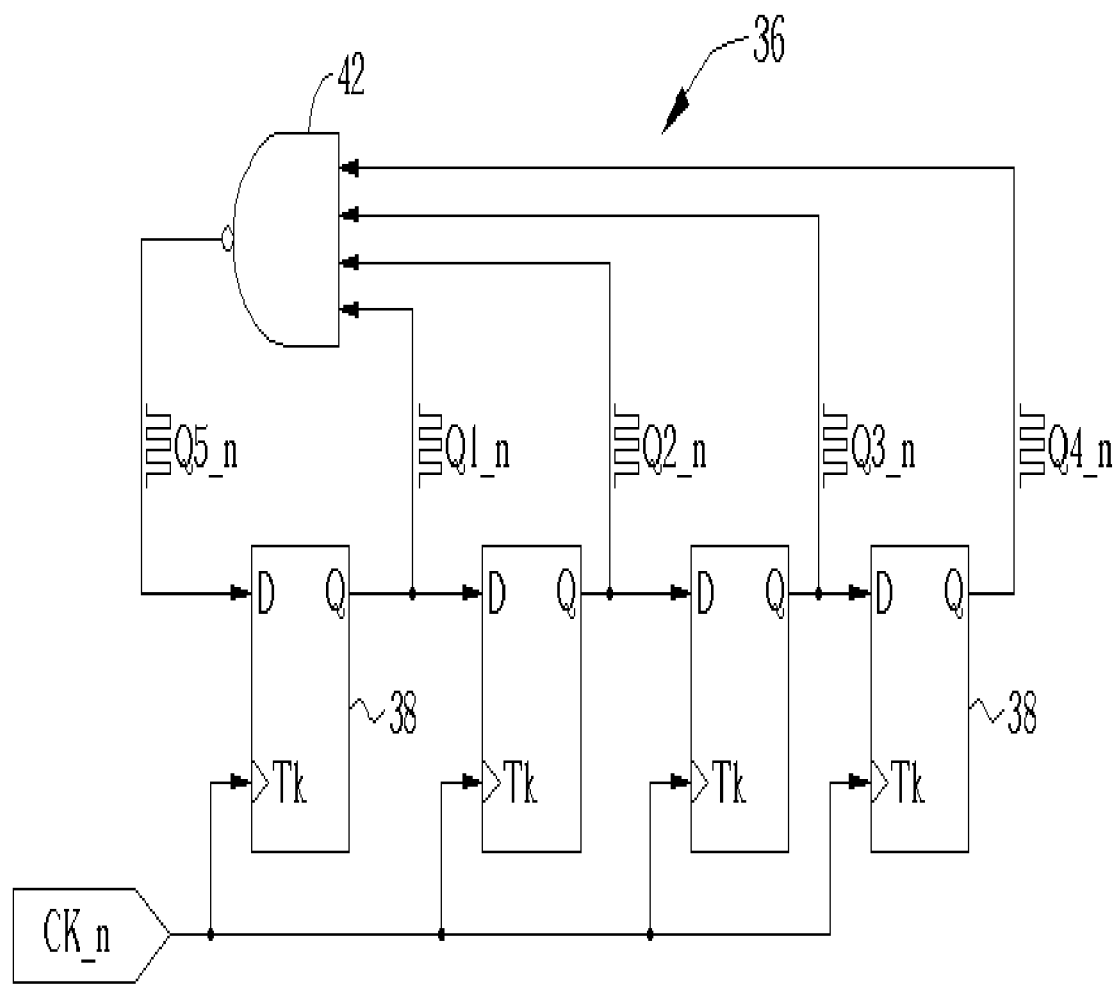
FIG. 7 is an embodiment of the state machine in FIG. 6.

In order to describe the present invention more clearly, the following example discusses how to achieve a frequency division with a ratio 0.8. Please refer to FIG. 7. FIG. 7 is an embodiment of the state machine 36 in FIG. 6. To achieve 0.8 frequency division, the state machine 36 comprises four flip-flops 38 (38 can be a D filp-flop triggered by rising edge) and a NAND gate 42 for generating five intermediate signals Q1_n to Q5_n (M=5). Each flip-flop 38 includes a clock node Tk simultaneously receiving CK_n (n=1 to 4, the first state machine 36 receives CK_1, and so on, as shown in FIG. 6). Furthermore, each flip-flop 38 includes an input node D and an output node Q. The first flip-flop 38 receives the intermediate signal Q5_n and outputs the intermediate signal Q1_n; the second flip-flop 38 receives the intermediate signal Q1_n and outputs the intermediate signal Q2_n, and so on, as shown in FIG. 7. The intermediate signal Q1_n to Q4_n are calculated by the NAND gate 42, the result being Q5_n for the input of the first flip-flop 38.

Figure 8:
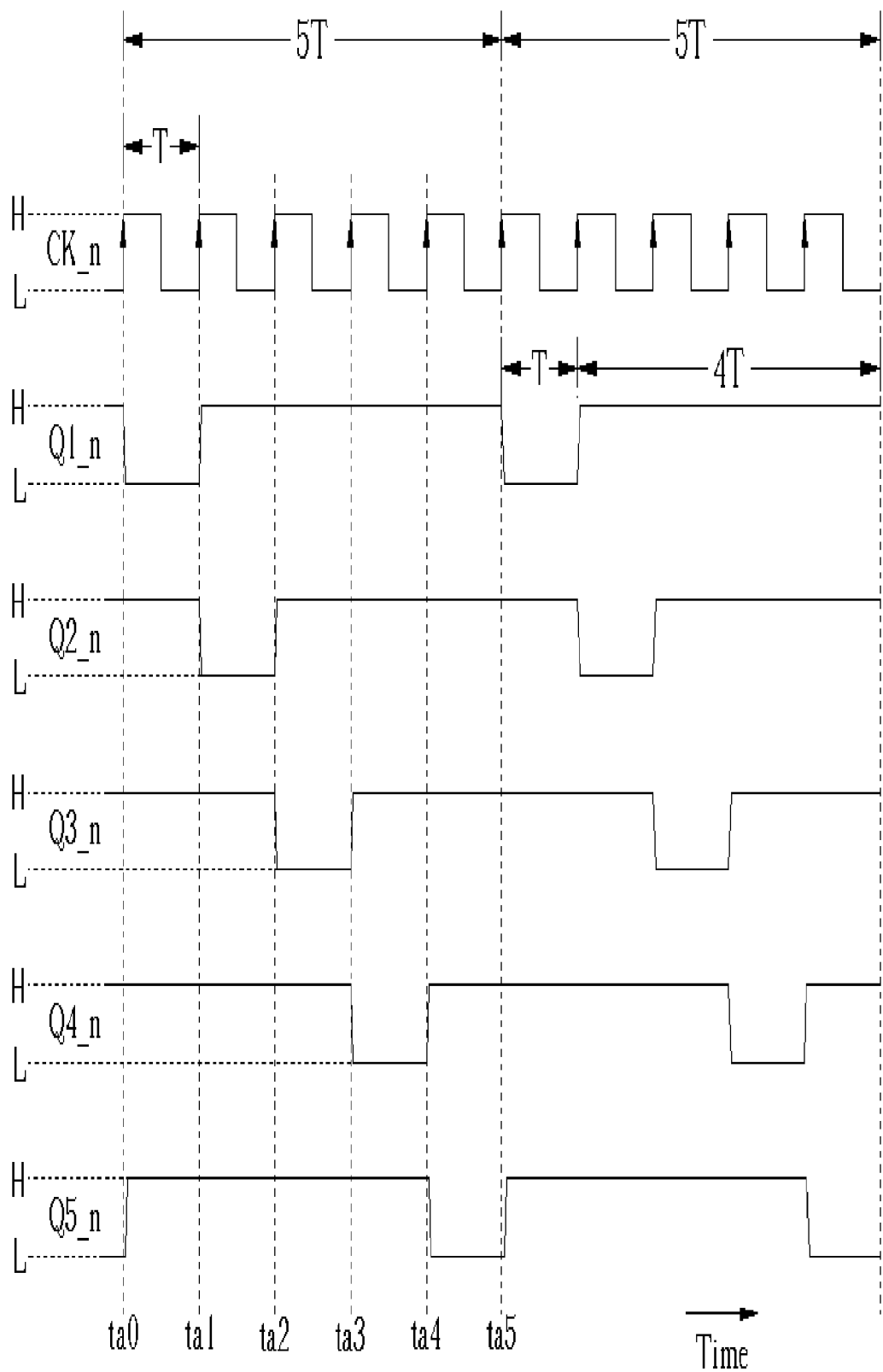
FIG. 8 shows signal states related to the operation of the state machine in FIG. 7.

Please refer to FIG. 8 (also referring to FIG. 7). When the state machine 36 in FIG. 7 is working, timing states of the related signals are shown in FIG. 8. The horizontal axis is time and the vertical axis is wave amplitude. Assume that before ta0, the levels of the intermediate signals Q1_n to Q4_n are level H, and after NAND operating, Q5_n keeps at level L. The clock CK_n starts triggering each flip-flop 38 by a rising edge at ta0. Due to the state of Q5_n before ta0 being level L, the first flip-flop 38 makes Q1_n drop from level H to level L at ta0, with other signals Q2_n to Q4_n still staying at the same level. Because of the state change of Q1_n, the state of Q5_n also rises from level L to level H at ta0. The clock CK_n with period T triggers each flip-flop 38 by rising edge at ta1 once again. Due to the state of Q5_n before ta1 (level H), Q5_n still stays at level H. The second flip-flop 38 makes Q2_n fall from level H to level L according to the state of Q1_n before ta1 (level L). The states of Q3_n to Q5_n are still at level H.

At ta2, the third flip-flop 38 makes Q3_n drop from level H to level L according to the state of Q2_n before ta2 (level L). Q2_n rises to level H according to the state of Q1_n (level H). In the same way, the clocks Q1_n to Q4_n respectively drop to level L at ta0, ta1, ta2, ta3, and stay at level L during 1T. At ta4, Q4_n rises to level H to make Q5_n fall to level L. At ta5, the states of Q1_n to Q5_n are the same as those of Q1_n to Q5_n before ta0. Therefore, the state changes of Q1_n to Q5_n from ta0 to ta4 will repeat after ta5.

Figure 9:
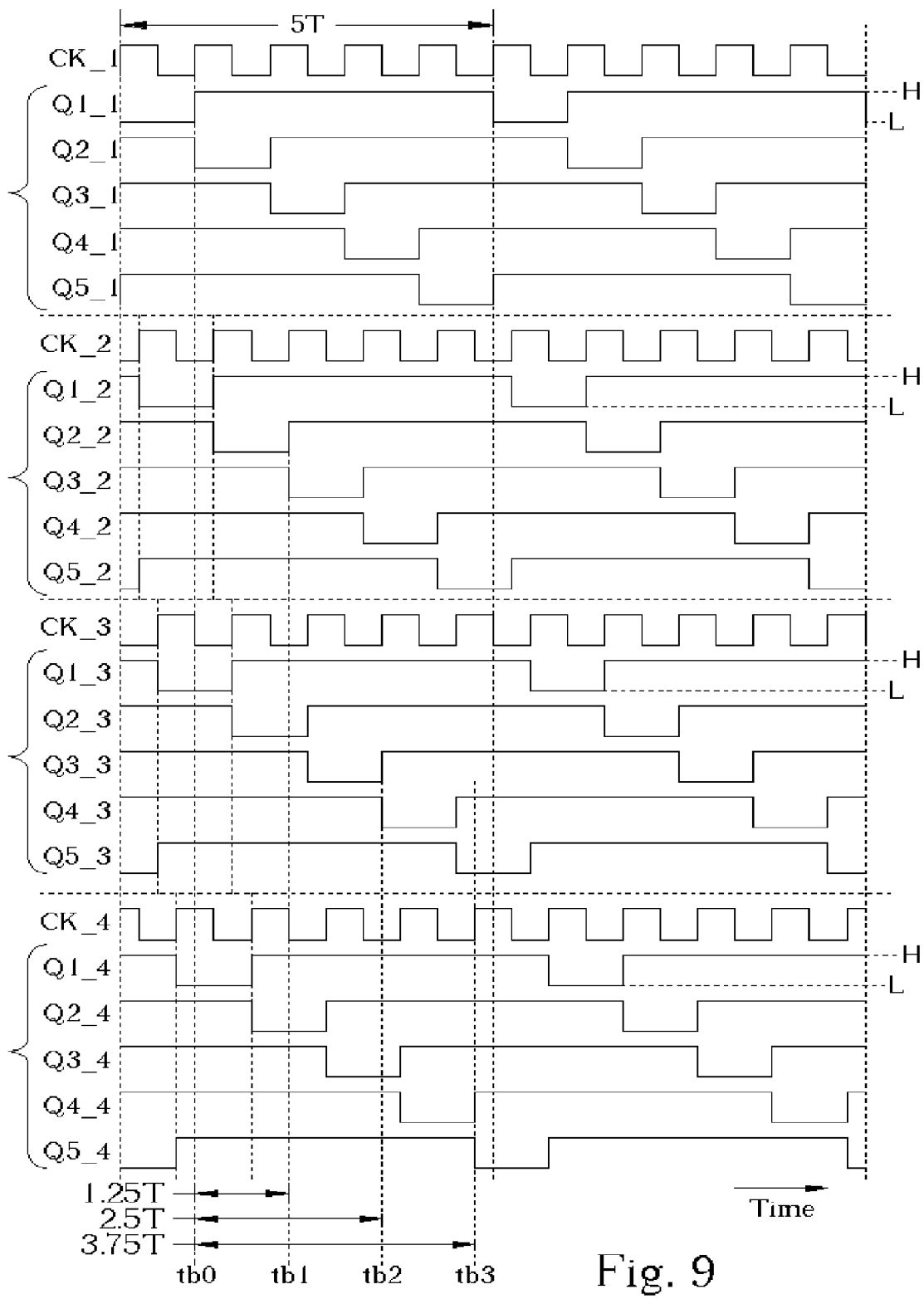
FIG. 9 shows signal states related to the operation of the state machines in FIG. 6.

In other words, the four flip-flops 38 in FIG. 7 can generate five intermediate signals Q1_n to Q5_n (M=5). The minimum period of each intermediate signal is 5T (1T is the period of CK_n) and the phase difference is equivalent to the time difference 1T. Please refer to FIG. 9 (and also refer to FIG. 6 to FIG. 8). FIG. 9 shows states of CK_1 to CK_4 in FIG. 6 and the corresponding intermediate signals Qm_n (n=1 to 4, m=1 to 5, M=5). The horizontal axis is time and the vertical axis is wave amplitude. As mentioned regarding FIG. 8, the period of each intermediate signal is 5T. Due to the phase difference between each CK_n equivalent to a time difference of k*T/4 (k is a integer), the phase difference between each intermediate signal triggered by different clocks is equivalent to a time difference of k*T/4 (k is a integer). In general, the phase difference between Qm_n and Q1_1 is equivalent to the time difference of ((m−1)+(n−1)/4)*T. For instance, as shown in FIG. 9, the phase difference between Q2_2 and Q1_1 is equivalent to a time difference of 1.25T, and the phase differences between Q3_3 and Q1_1, Q4_4 and Q1_1 are equivalent to a time differences of 2.5T and 3.75T, respectively.

Figure 10:
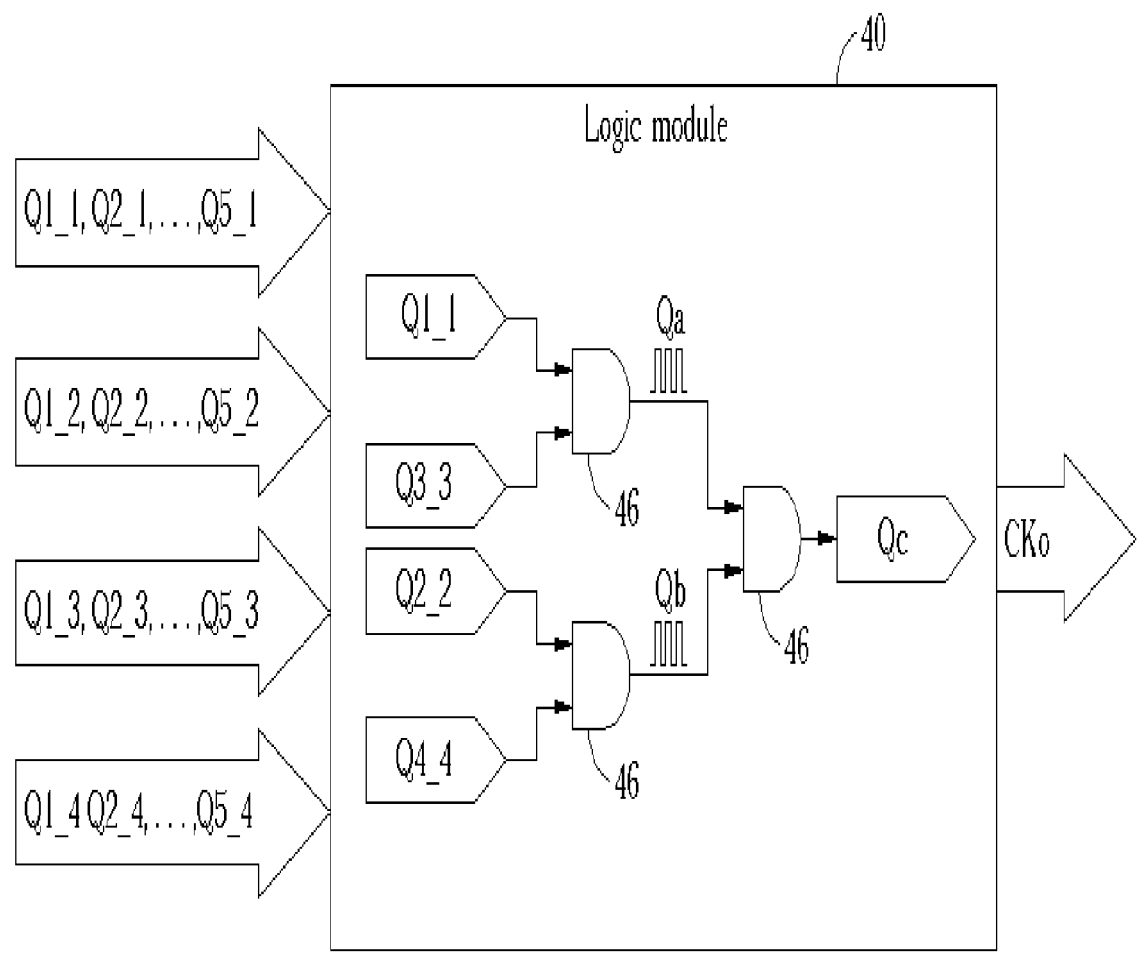
FIG. 10 is an embodiment of the logic module in FIG. 6.
Figure 11:
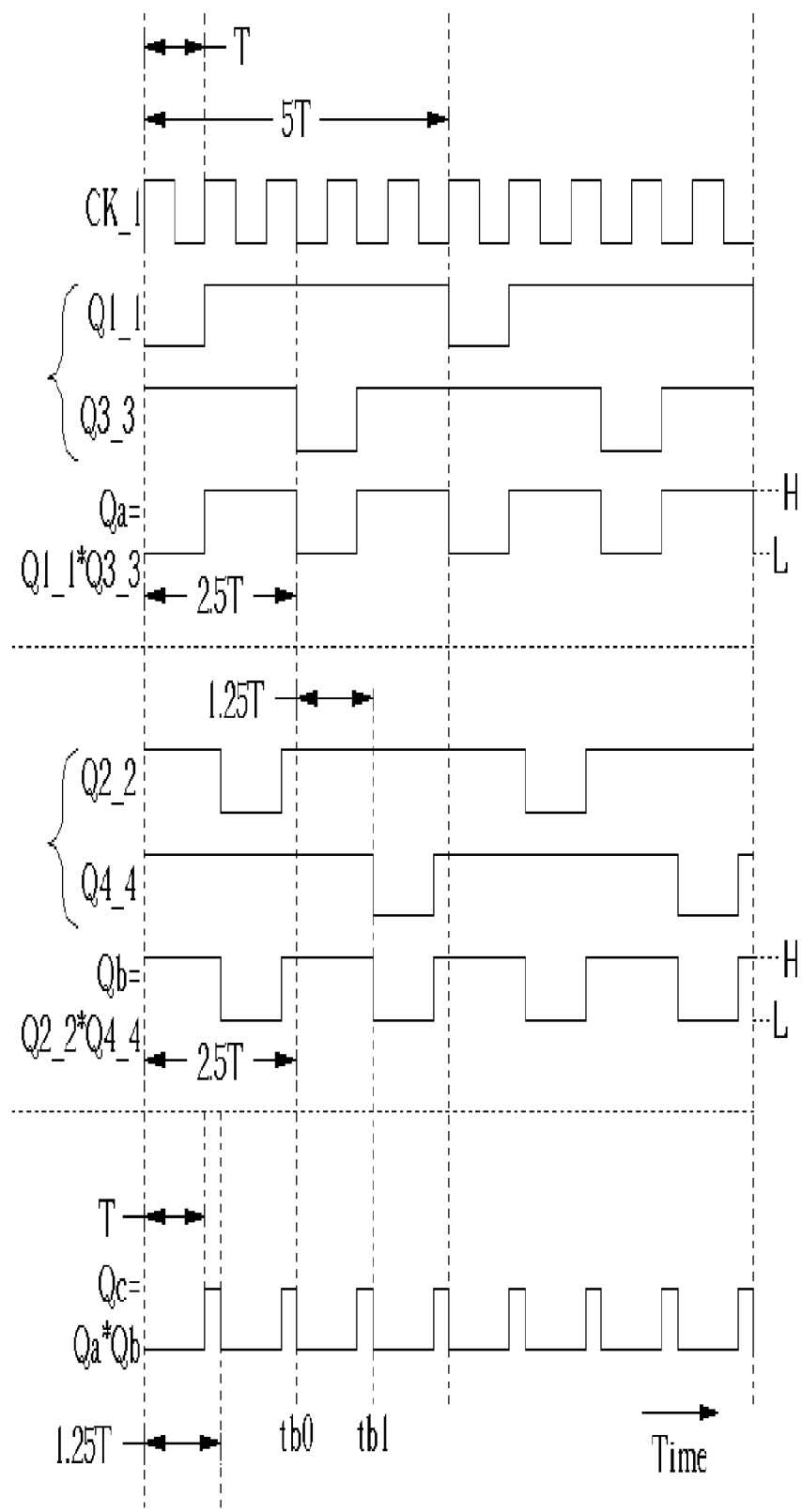
FIG. 11 shows signal states related to the operation of the logic module in FIG. 10.

The logic module 40 can generate at least one period (5/4)T clock as the output clock CKo by using the intermediate signals Qm_ns. Please refer to FIG. 10 and FIG. 11 (also referring to FIG. 6 to FIG. 9). FIG. 10 is an embodiment of the logic module 40 in FIG. 6. FIG. 11 shows signal states related to the operation of the logic module 40 in FIG. 10. As shown in FIG. 10, a signal Qa is generated by the AND operation on Q1_1 and Q3_3, a signal Qb is generated by the AND operation on Q2_2 and Q4_4, and a signal Qc is generated by the AND operation on Qa and Qb. Any of Qa, Qb or Qc can be selected as the output clock CKo.

As shown in FIG. 11, Qa is generated by the AND operation on Q1_1 and Q3_3, the time difference between Q1_1 and Q3_3 being 2.5T, the period of Qa being 2.5T. In other words, Qa repeats the cycle twice during 5T. In the same way, Qb is generated by the AND operation on Q2_2 and Q4_4, the period of Qb also being 2.5T. Due to the phase differences between Q1_1 and Q3_3, Q2_2 and Q4_4, the phase difference between Qa and Qb is equivalent to a time difference 1.25T. Using Qc as the output clock CKo can achieve non-integer frequency division according to the present invention. Clock CK_n with period T is divided by 0.8 to generate the output clock with period 1.25T. Qa and Qb with periods of 2.5 T also can be regarded as the output clock CKo, which is the result of being divided by 0.4.

Figure 12:
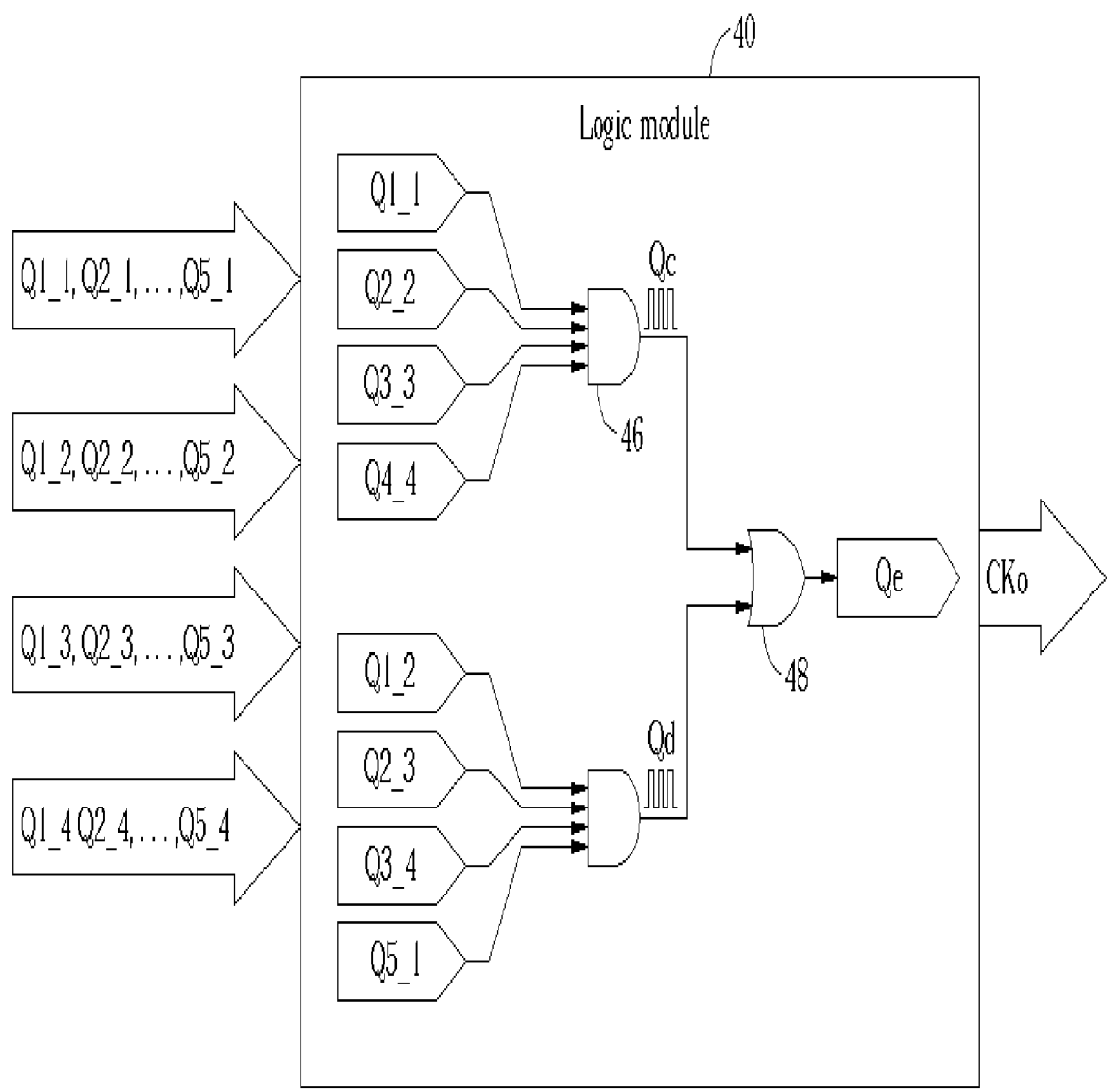
FIG. 12 is another embodiment of the logic module in FIG. 6.
Figure 13:
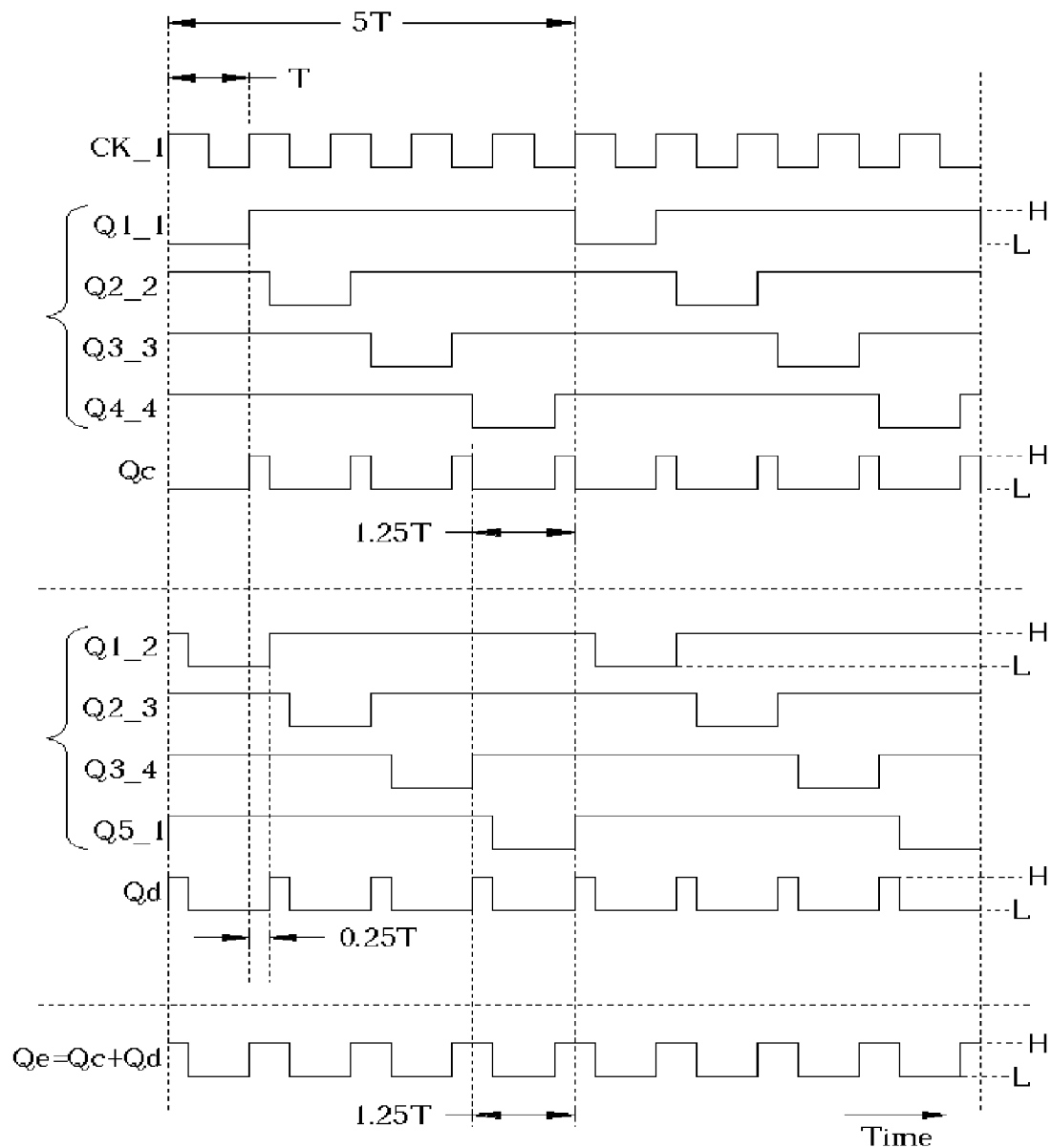
FIG. 13 shows signal states related to the operation of the logic module in FIG. 12.

Due to the phase differences between each intermediate signal being equivalent to a time differences (T/4)*K (K is an integer), the logic module 40 can selectively use different intermediate signals to perform logic operation for generating particular signals with different phases as output clocks. Please refer to FIG. 12 and FIG. 13. FIG. 12 is another embodiment of the logic module 40 in FIG. 6. FIG. 13 shows the signal states related to the operation of the logic module 40. As shown in FIG. 12, Qd is generated by the AND operation on Q1_2, Q2_3, Q3_4, and Q5_1 in the logic module 40. As shown in FIG. 13, due to the phase differences among Q1_2, Q2_3, Q3_4, and Q5_1, and among Q1_1, Q2_2, Q3_3, and Q4_4 being equivalent to the time difference T/4, the periods of Qc and Qd generated by the AND operation are the same as 1.25T, and the phase difference between Qc and Qd is equal to the time difference T/4. Qe is generated by the OR operation on Qc and Qd, as shown in FIG. 12. The period of Qe is also 1.25T, as shown in FIG. 13, and the duty cycle of Qe is different from the duty cycles of Qc and Qd. Qc, Qd, and Qe can be regarded as the output clock CKo to generate the output clock with period 1.25T for achieving 0.8 frequency division.

Figure 14:
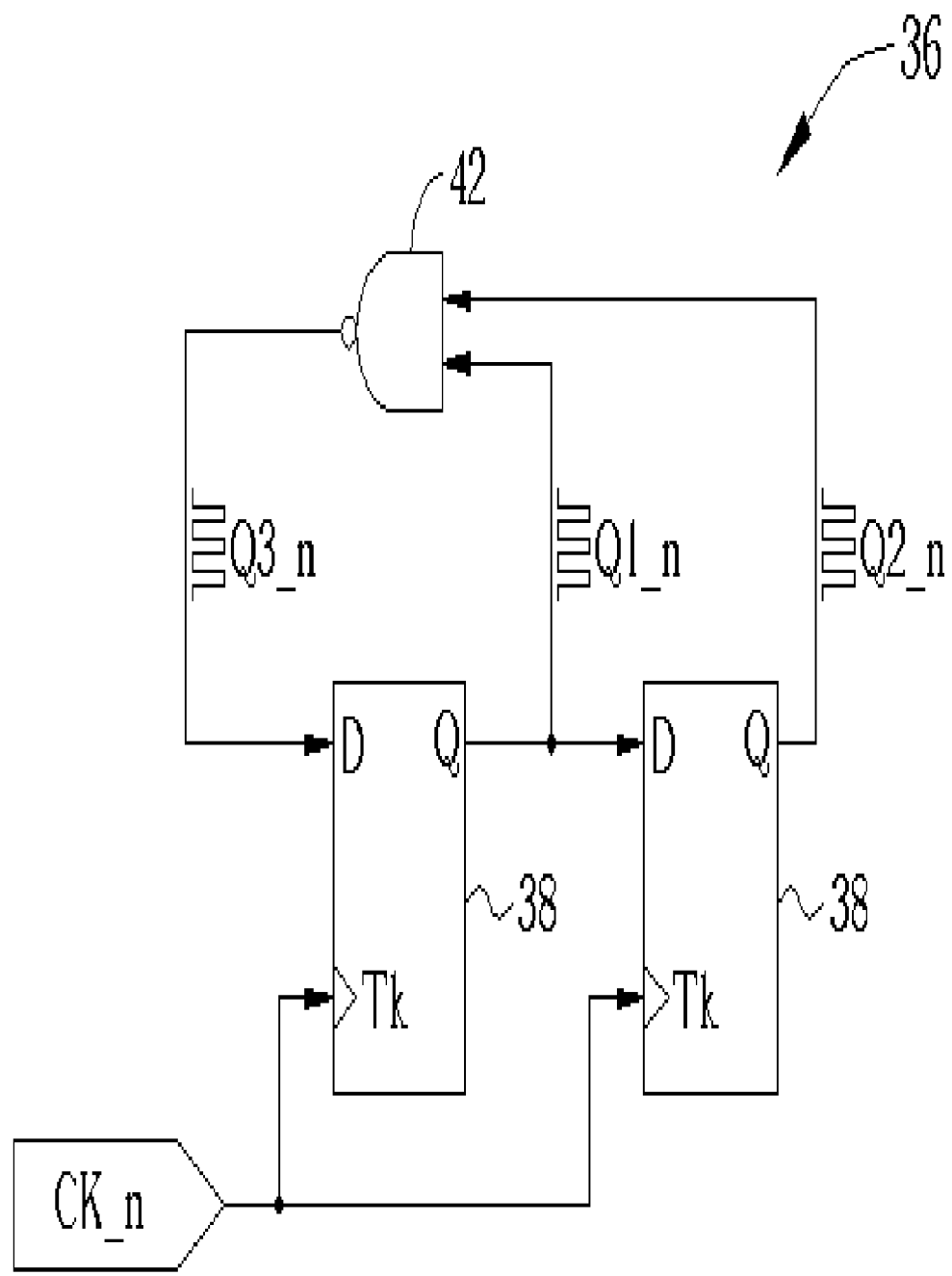
FIG. 14 is another embodiment of the state machine in FIG. 6.
Figure 15:
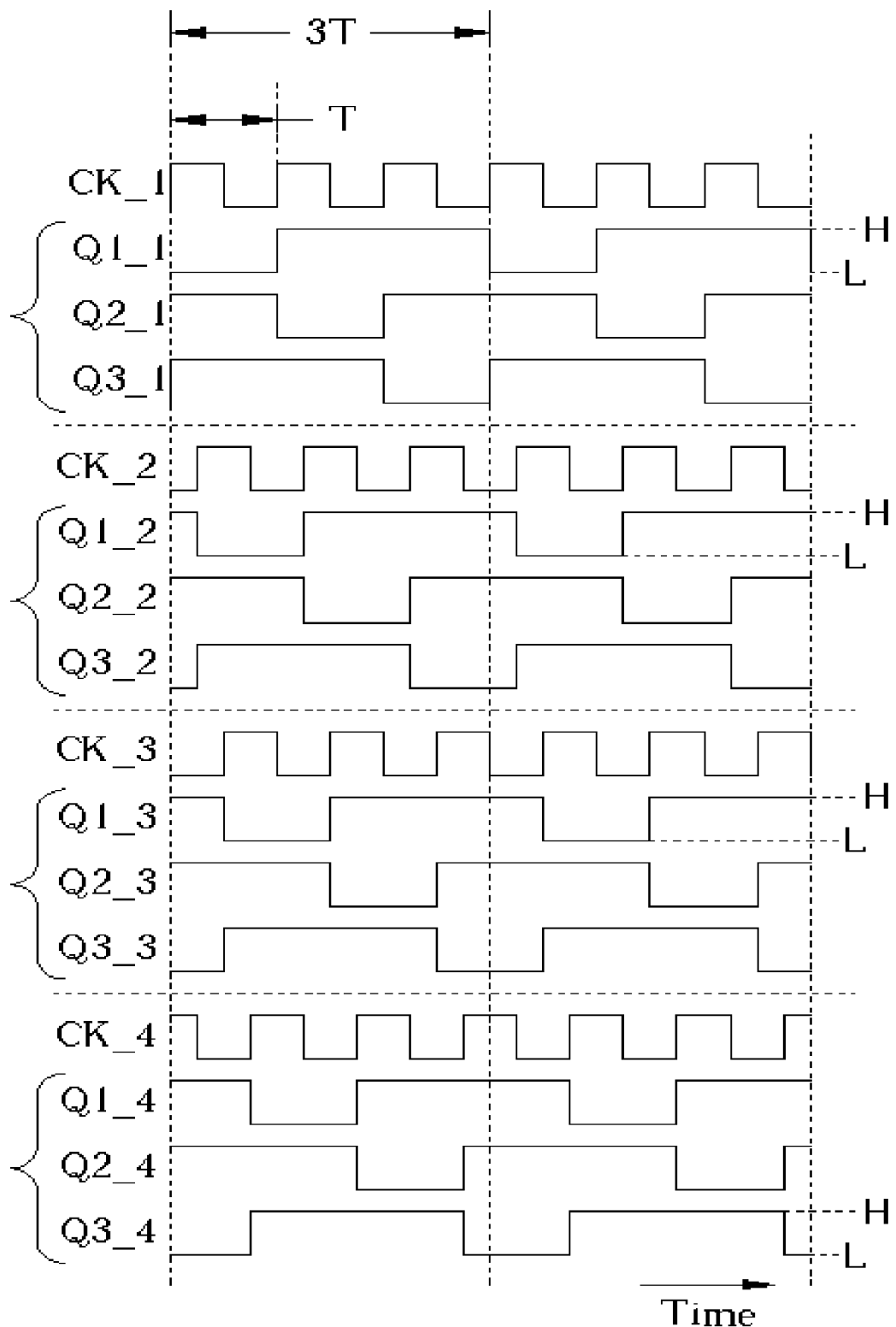
FIG. 15 shows signal states related to the operation of the state machine in FIG. 14.

Besides generating the output clock with period 1.25T according to CK_1 to CK_4 with period T, the present invention also can generate an output clock with period less than 1T by non-integer frequency division. Please refer to FIG. 14 to FIG. 17. For generating the output clock with period less than 1T according to CK_n with period T, the circuit in FIG. 14 is used to form the state machines in FIG. 6. In FIG. 14, three intermediate signals Q1_n to Q_3 (M=3 in FIG. 6) are generated by two flip-flops 38 and a NAND gate 42 under CK_n triggering. As shown in FIG. 15, the phases of CK_1 to CK_4 are uniformly distributed in T for generating Q1_1 to Q3_1, Q1_2 to Q3_2, Q1_3 to Q3_3, and Q1_4 to Q3_4 by the state machines in FIG. 14. The periods of each intermediate signal are 3T, and each period includes 1T staying at level L and 2T staying at level H.

Figure 16:
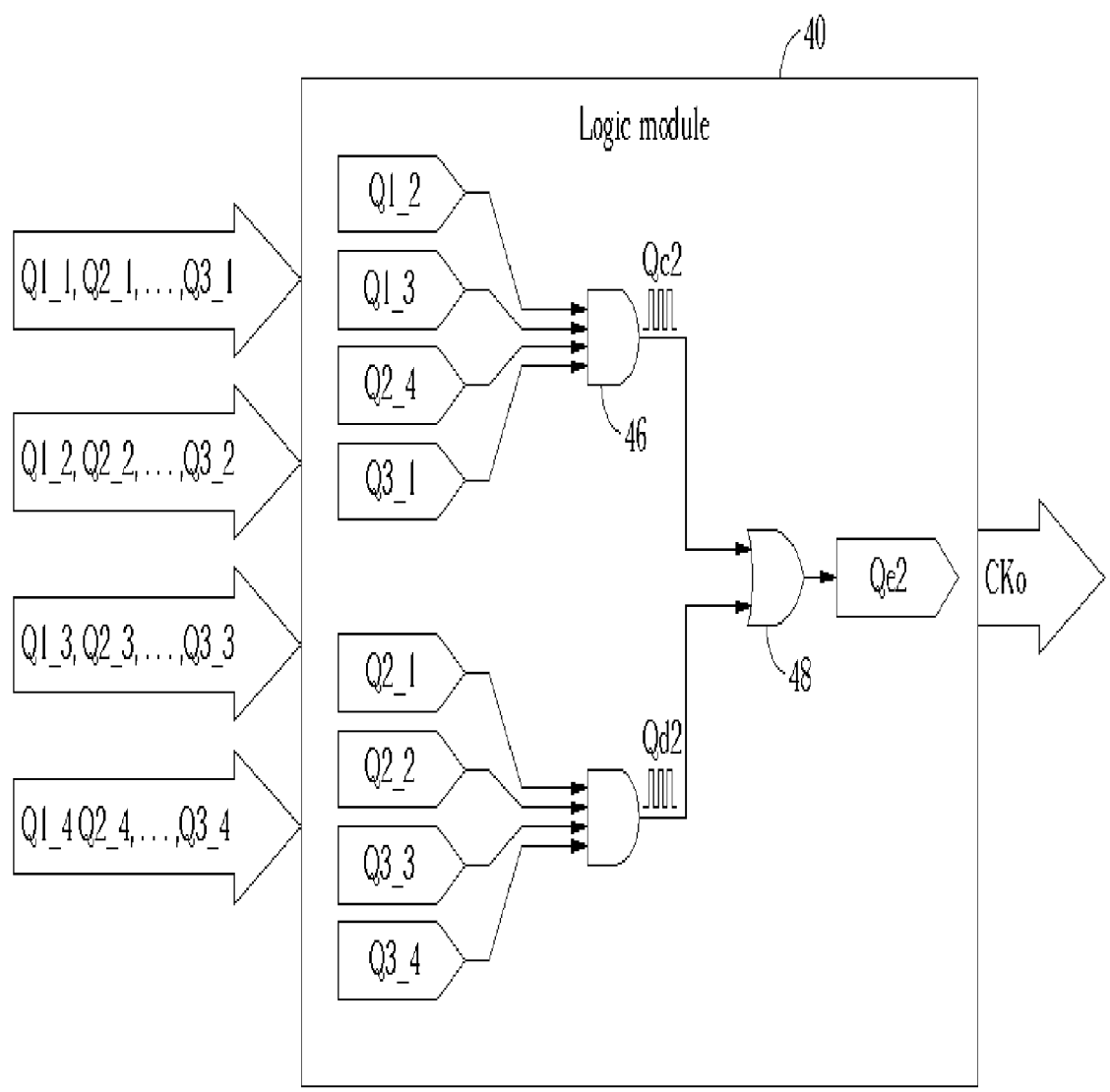
FIG. 16 is another embodiment of the logic module in FIG. 6.
Figure 17:
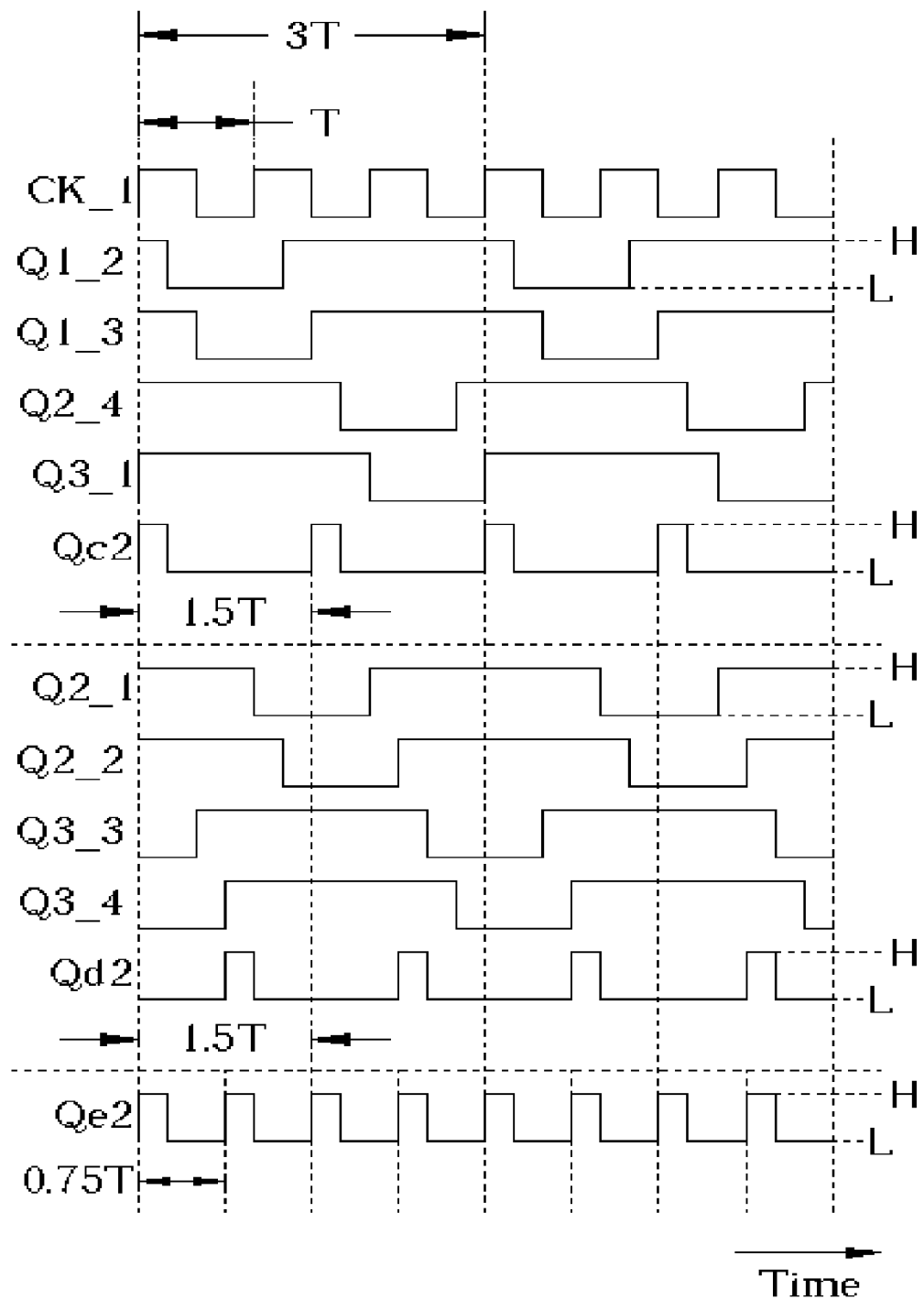
FIG. 17 is signal states related to the operation of the logic module in FIG. 16.

The logic module 40 in FIG. 6 can be established by the circuit in FIG. 16 with the state machine in FIG. 14. As shown in FIG. 16, Qc2 is generated by the AND operation on Q1_2, Q1_3, Q2_4, and Q3_1, and Qd2 is generated by the AND operation on Q2_1, Q2_2, Q3_3, and Q3_4. Qe2 is generated by the OR operation on Qc2 and Qd2, and the period of Qe2 is 0.75T for achieving 4/3 frequency division. As shown in FIG. 17, Qc2 repeats twice during 3T, the period of Qc2 being 1.5T. Similarly, the period of Qd2 is also 1.5T, and the phase difference between Qc2 and Qd2 is equivalent to a time difference 0.75T. Therefore, the period of Qe2 generated by the OR operation on Qc2 and Qd2 is 0.75T. Qe2 is regarded as the output clock CKo in the logic module 40 for achieving 4/3 frequency division, thus the output clock with higher frequency is generated by CK_n with period T.

In the embodiments of FIG. 7 to FIG. 13, and FIG. 14 to FIG. 17, the state machines 36 in FIG. 6 are formed by connecting an AND gate 42 and flip-flops 38, as shown in FIG. 7 and FIG. 14. The intermediate signals Qm_n generated by this layout include 1T staying at level L, as shown in FIG. 8, FIG. 9, and FIG. 15. The state machine 36 of the present invention also can be formed by other circuits for achieving non-integer frequency division. Please refer to FIG. 18 to FIG. 20. Suppose that each state machine 36 in FIG. 6 generated five intermediate signals with period 5T under CK_n with period T triggering, a period 2T of each intermediate signal staying at level L. The intermediate signals generated by the four state machines 36 are shown in FIG. 18.

Figure 18:
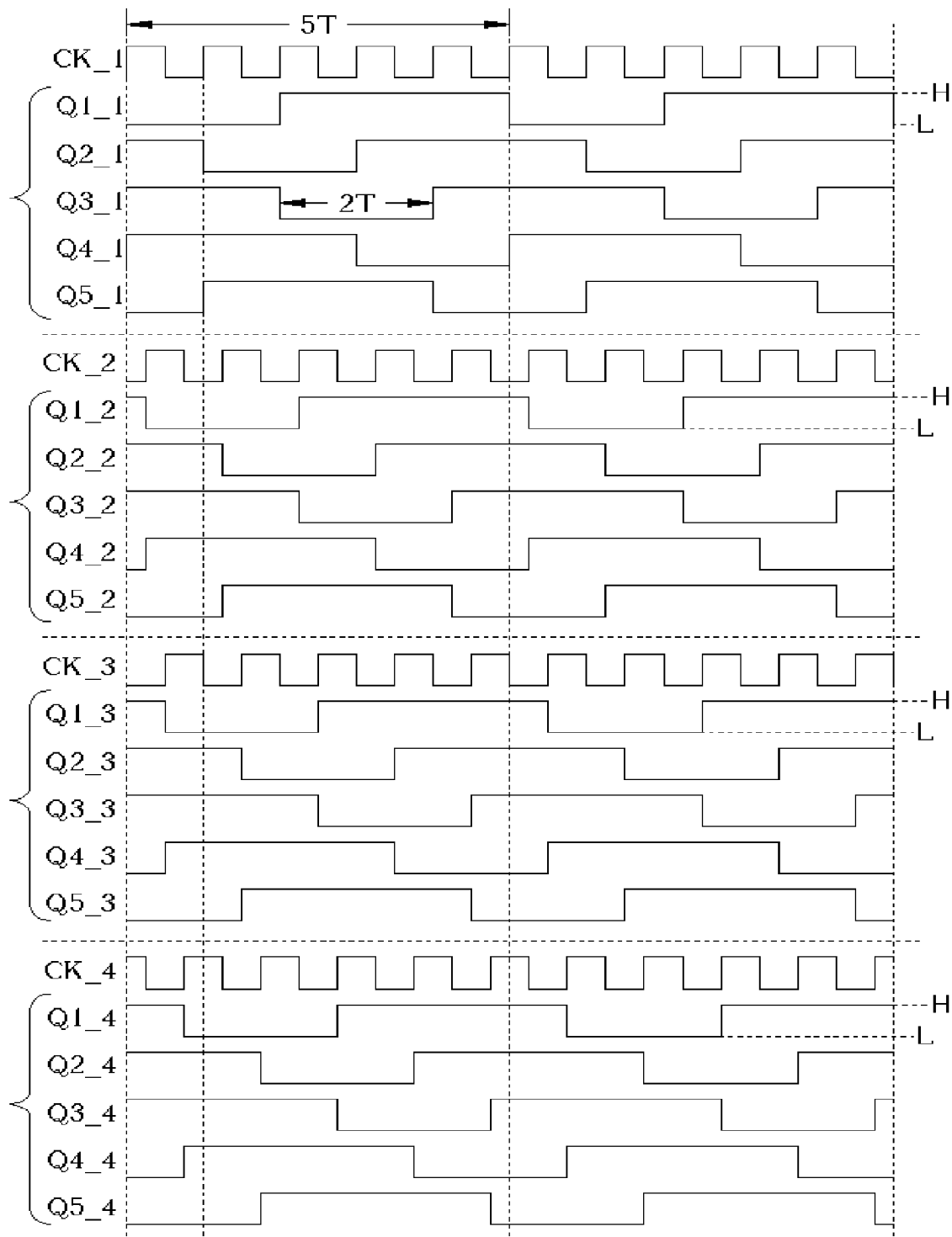
FIG. 18 shows signal states related to another embodiment of the state machines in FIG. 6.
Figure 19:
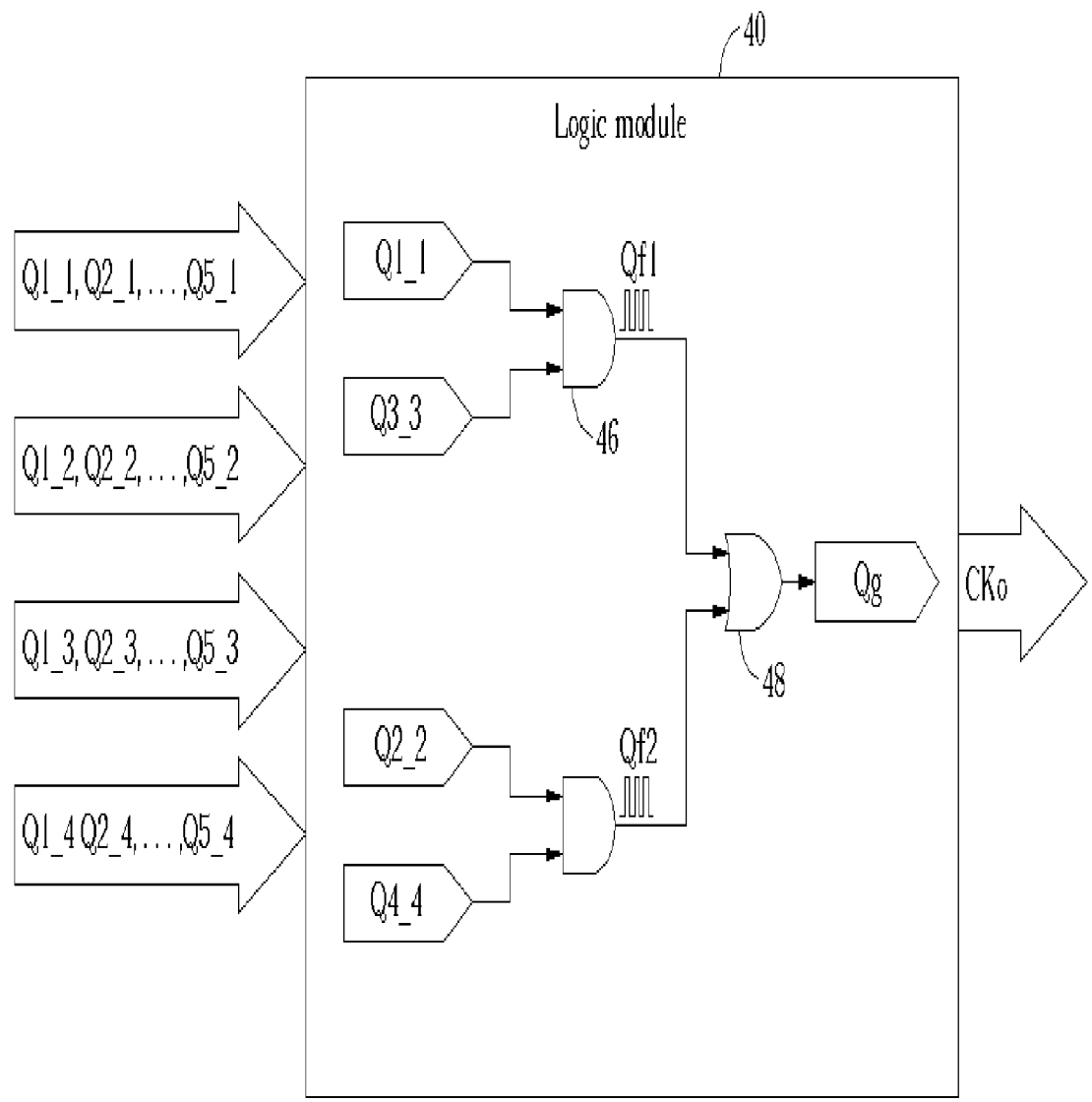
FIG. 19 is an embodiment when the logic module in FIG. 6 cooperates with the signals in FIG. 18.
Figure 20:
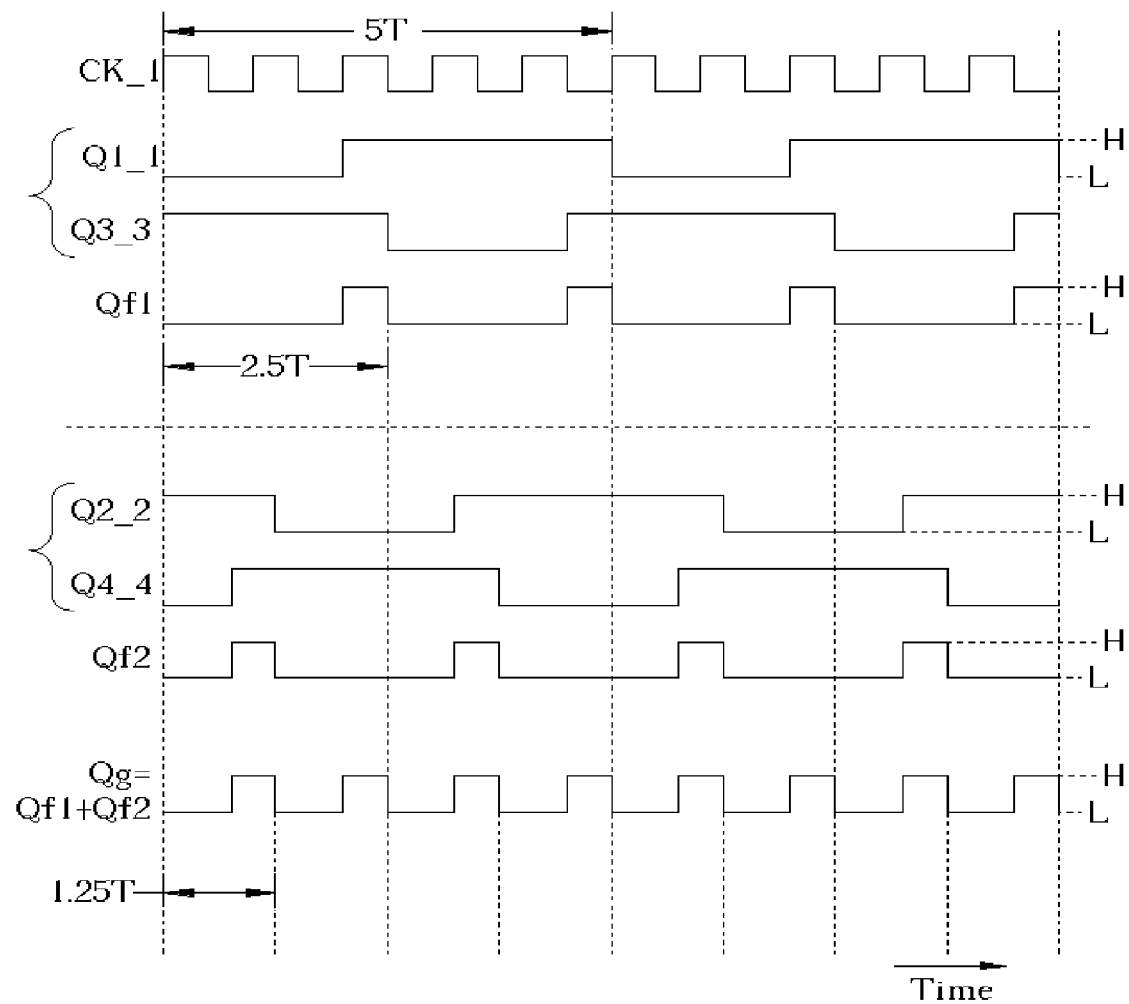
FIG. 20 shows signal states related to the operation of the logic module in FIG. 19.

Although the waves of Qm_n in FIG. 18 differ from those in FIG. 9, selecting appropriate logic modules also can achieve non-integer frequency division. The logic module 40 in FIG. 6 can be formed by the circuit in FIG. 19, performing the AND operation on the intermediate signals Q1_1 and Q3_3, and Q2_2 and Q4_4 (FIG. 18) for respectively generating Qf1 and Qf2, then performing the OR operation on Qf1 and Qf2 for generating Qg with period 1.25T as CKo. The signals generated by the logic module 40 in FIG. 19 are shown in FIG. 20. The period of Qg is 1.25T, as shown in FIG. 20.

Figure 21:
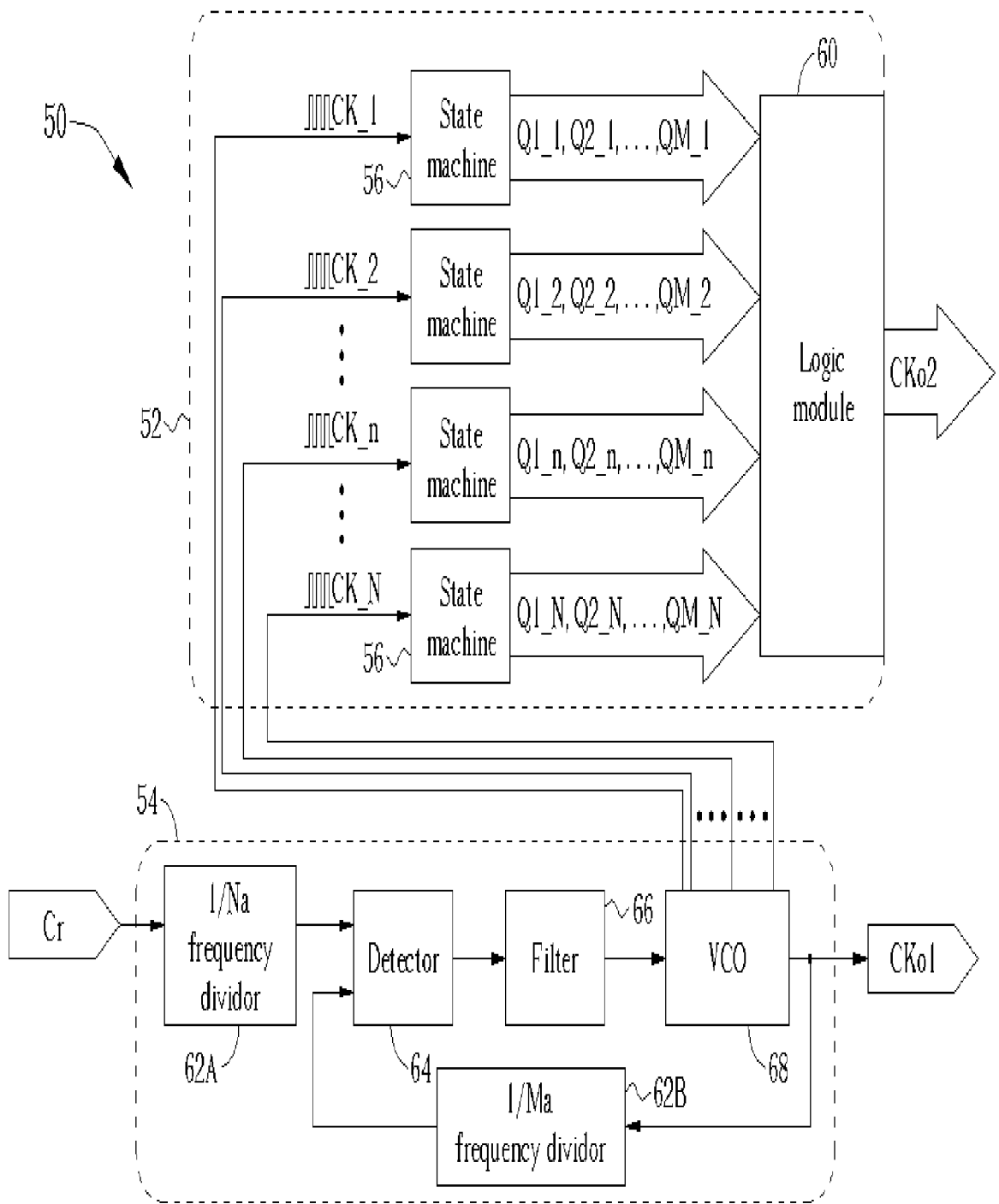
FIG. 21 shows a frequency division circuit located in a signal circuit and a phase-locked circuit for generating different frequency signals.

The following discusses applications according to the present invention. Please refer to FIG. 21. FIG. 21 shows a frequency division circuit 52 located in a signal circuit 50 and a phase-locked circuit 54 for generating different frequency signals. The phase-locked circuit 54 comprises two frequency dividors 62A and 62B, a phase/frequency difference detector 64, a filter 66, and a voltage-controlled oscillator 68 for generating an output clock CKo1 according to a reference clock Cr. As mentioned above, the voltage-controlled oscillator 68 can be a chain oscillator, providing N clocks CK_1 to CK_N with period T, the phases being uniformly distributed in 360 degrees. Therefore the voltage-controlled oscillator 68 can be a reference clock circuit, and the frequency division circuit 52 of the present invention takes CK_n as the reference clocks for achieving non-integer frequency division and at least providing an output clock CKo2 with a different period. The signal circuit 50 can provide many clocks with different frequencies for triggering circuits in multiple-clock systems.

Figure 22:
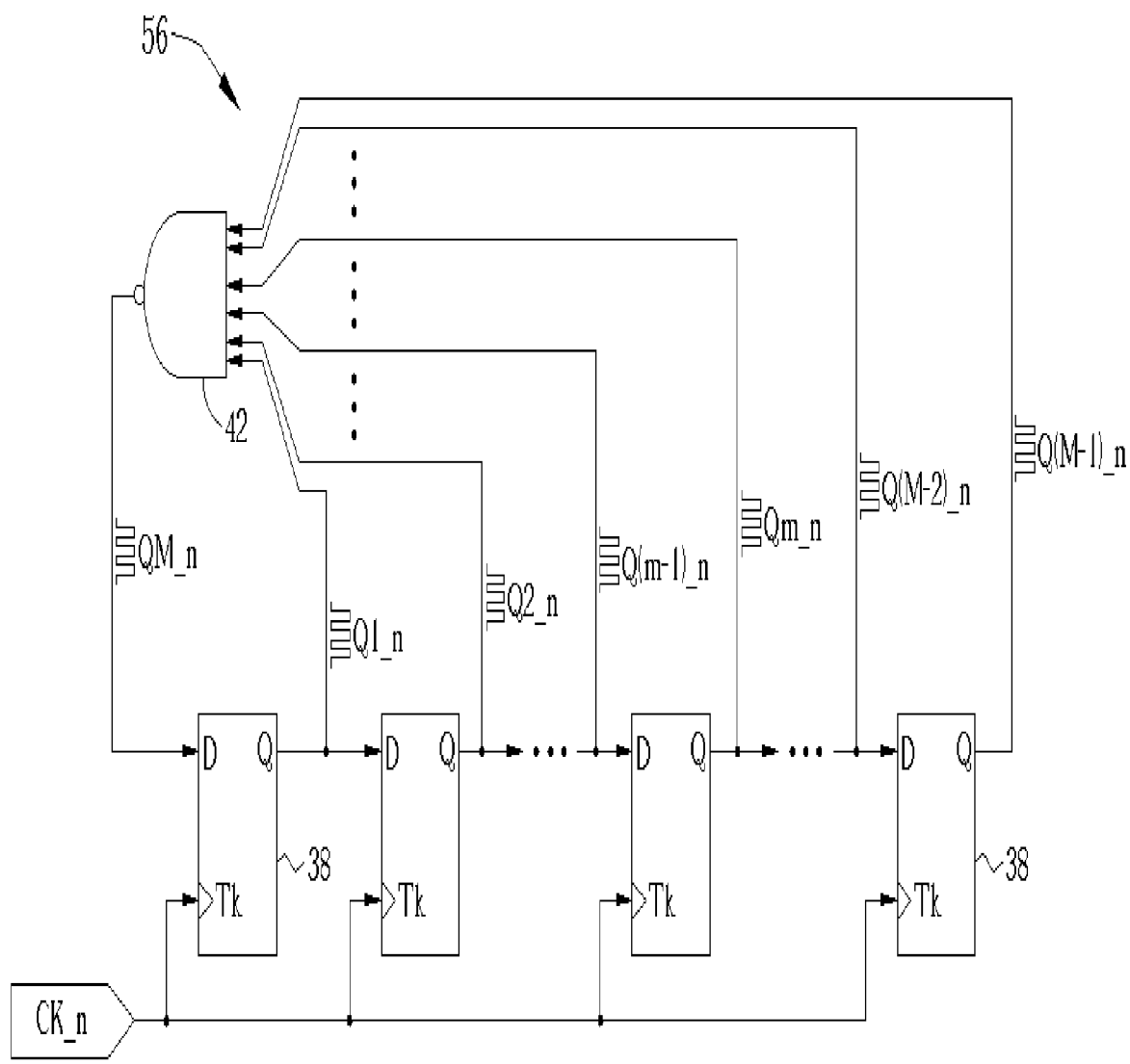
FIG. 22 is an embodiment of the state machine in FIG. 21.
Figure 23:
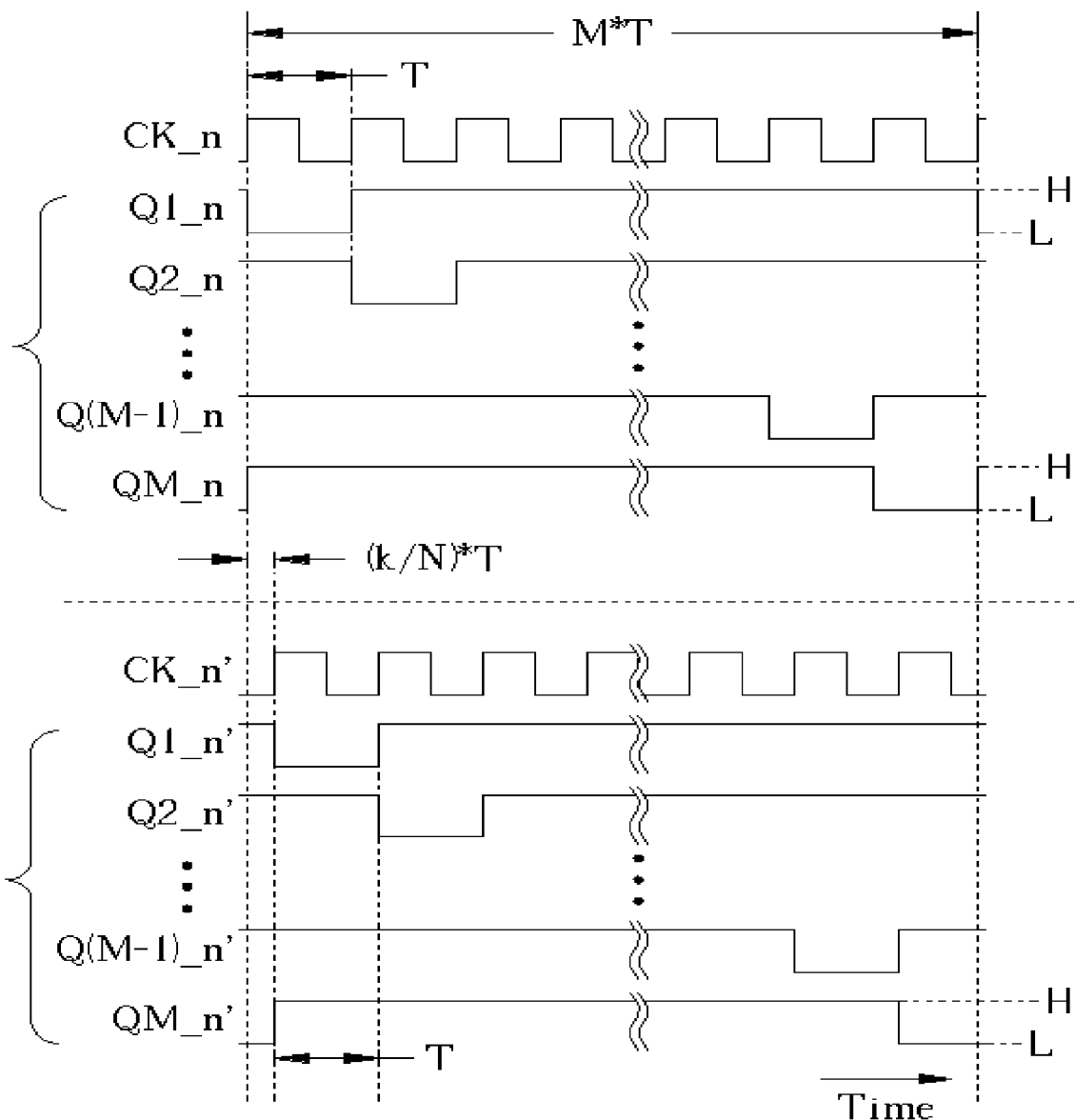
FIG. 23 is intermediate signal states of the state machines in FIG. 22.

The frequency division circuit 52 of the present invention includes N state machines for forming a triggering module. The N state machines generate M intermediate signals Q1_n to QM_n triggered by CK_n. The logic module 60 does logic operations of these intermediate signals to generate the output clock CKo2. Please refer to FIG. 22 and FIG. 23. The state machines 50 are formed by the circuit in FIG. 22; that is to say, generating intermediate signals Q1_n to QM_n by (M-1) flip-flops 38 and a NAND gate under CK_n triggering. FIG. 23 shows Qm_n generated by the state machines in FIG. 22. As shown in FIG. 23, the period of each intermediate signal is M*T, each intermediate signal including 1T staying at level L. For different clocks CK_n and CK_n, the phase difference between them is equivalent to a time difference (k/N)*T (k is an integer). Therefore, for Qm_n and Qm_n, the phase difference between them is also equivalent to the time difference (k/N)*T.

Due to the phase difference between Qm_n and Qm_n being equivalent to the time difference (k/N)*T, and the periods of each intermediate signal being M*T, after performing logic operations of intermediate signals in the logic module 60, the period M*T can be divided by (T/N). Therefore the minimum period is a factor of M*N. For instance, in FIG. 7 to FIG. 9, there are four clocks (N=4), and each clock triggers five intermediate signals (M=5). The period of the output clock generated by the logic module is K*(T/4), and the integer K can be 2, 4, 5, 10, or 20. In FIG. 11, the periods of Qa and Qb are 2.5T (K=10), and the period of Qc is 1.25T (K=5). Similarly, in FIG. 14 to FIG. 17, N is 4 and M is 3; therefore, the period of the output clock is K*(T/4), and K can be 2, 3, 6, or 12. In FIG. 17, the periods of Qc2 and Qd2 are (6/4)*T, and the period of Qe2 is (3/4)*T.

Figure 24:
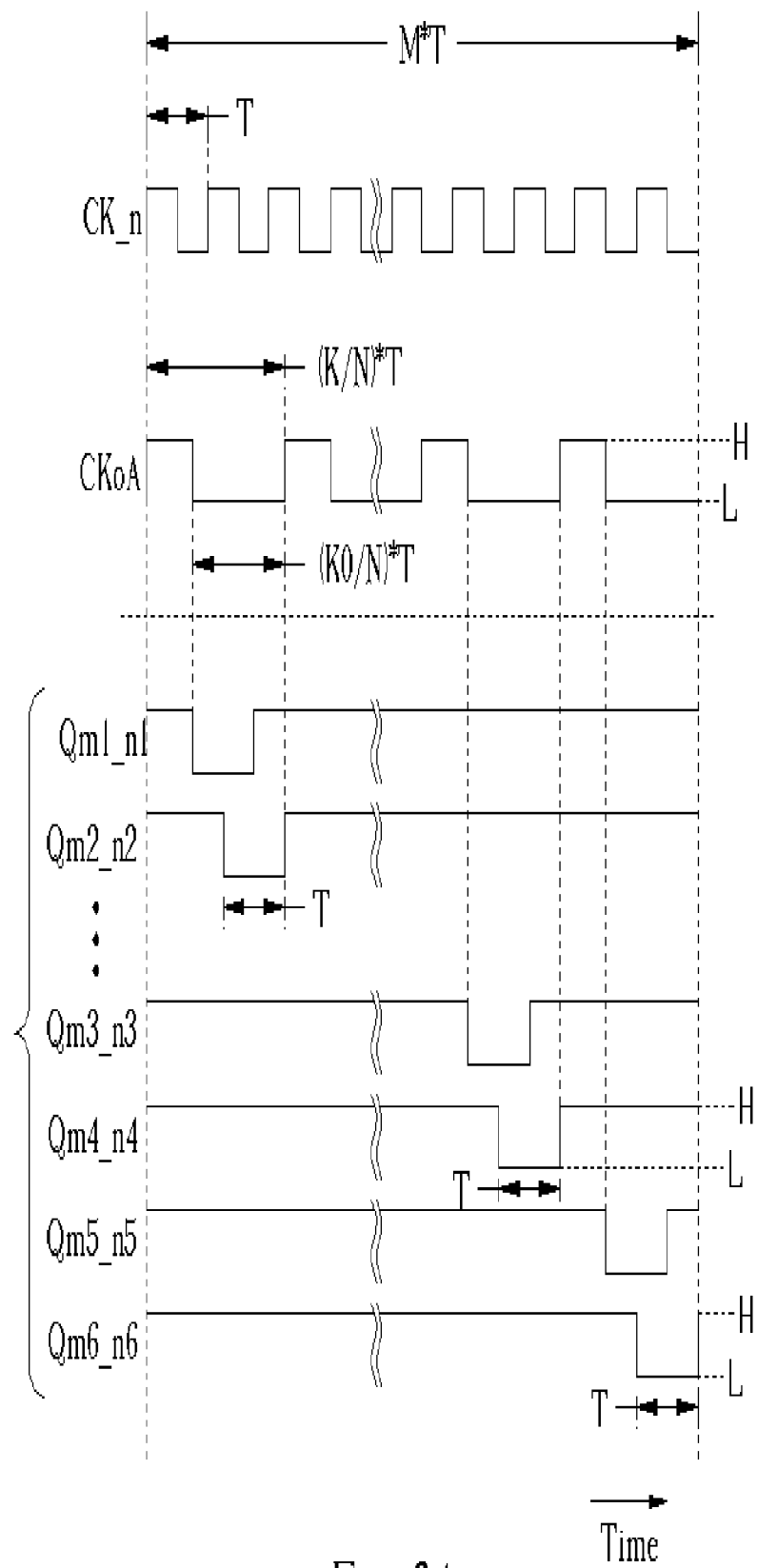
FIG. 24 and FIG. 25 show states when the logic module in FIG. 21 works under different conditions for achieving non-integer frequency division.
Figure 25:
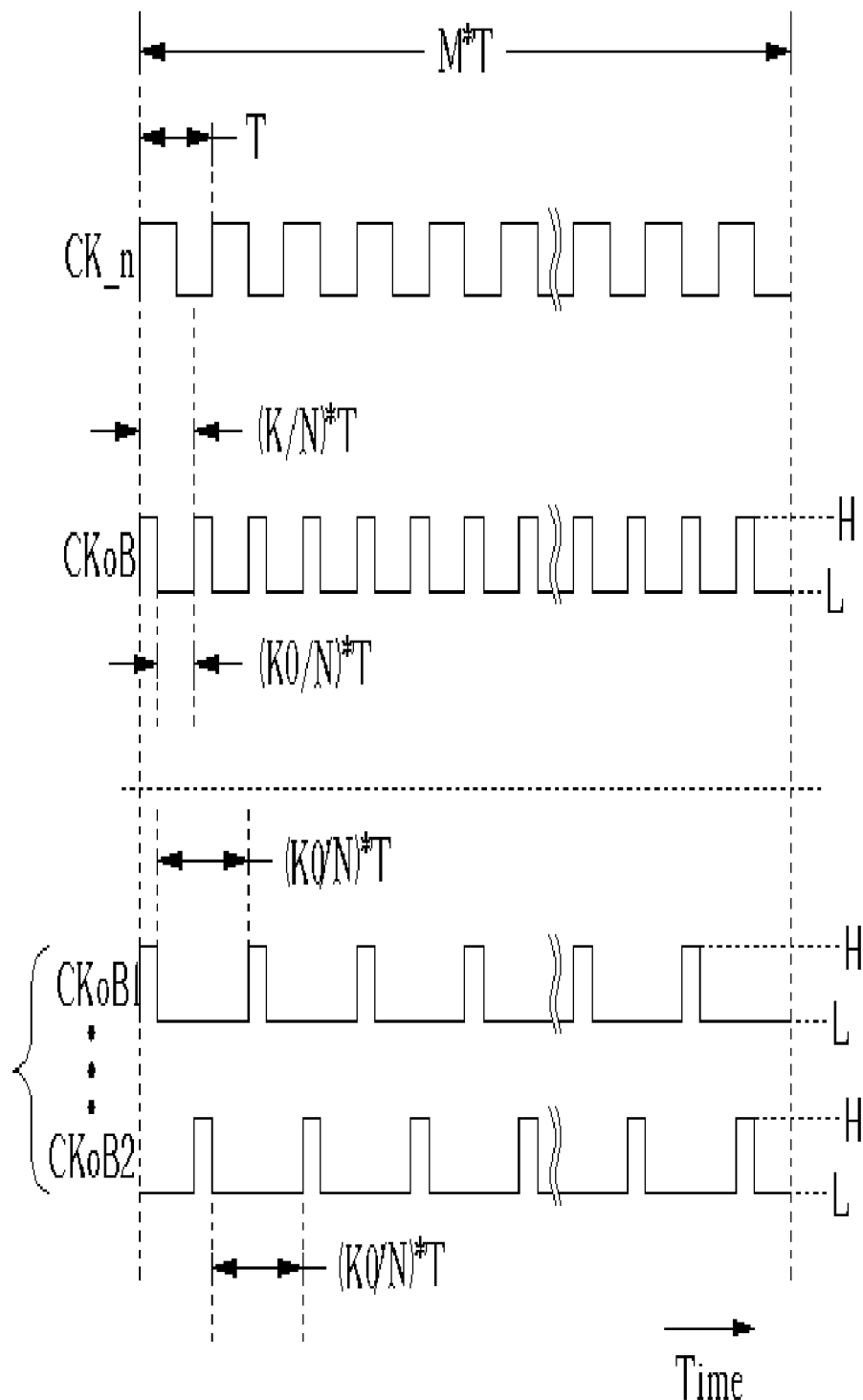

When designing the logic module 60 in FIG. 21, the required circuit is designed for achieving logic operations according to the characteristics of the output clocks. Please refer to FIGS. 24 and 25. FIGS. 24 and 25 show the output clock states with different frequencies. As shown in FIG. 24, the output clock CKoA is generated by combining each intermediate signal Qm_n, the period of CKoA being (K/N)*T, and every period including (K0/N)*T staying at level L (K and K0 are integers). If the period of CKoA at level L is not less than the period of the intermediate signal at level L, then the intermediate signals with appropriate phases can be directly selected for forming the level L part of CKoA by the AND operation. As shown in FIG. 24, suppose that the period of CKoA at level L is longer than the period of each intermediate signal at level L, then the output clock CKoA is generated by adding a plurality of intermediate signals. The part of the output clock CKoA at level L during the first cycle is generated by adding Qm1_n1 and Qm2_n2. The part of the output clock CKoA at level L during another cycle is generated by adding Qm5_n5 and Qm6_n6. As shown in FIGS. 10 and 11, Qc is generated in the same way.

In addition, if the part of the output clock at level L is less than the part of the intermediate signal at level L, then the output clock is divided into several lower frequency signals. As shown in FIG. 25, suppose that the logic module generates the output clock CKoB with period (K/N)*T, and the part of CKoB at level L is less than the part of each intermediate signal at level L. Then CKoB is divided into a plurality of low frequencies such as CKoB1, CKoB2, and so on. In other words, CKoB is the result of the OR operation on CKoB1, CKoB2, and so on. Due to the frequencies of CKoB1 and CKoB2 being less, and the periods of them being longer, the part staying at level L is not less than the part that the intermediate signals stay at level L, then the low frequency signals can be generated by the method in FIG. 24. In other words, the signals with low frequency are generated by the AND operation on each intermediate signal, then the signals with high frequency are generated by the OR operation on low frequency signals. The embodiments in FIGS. 16, 17, 19, and 20 are established by this way.

Noted that there are many ways to establish logic modules of the present invention, and these not limited to AND or OR operations. For instance, the signal generated by the AND operation on Qm_n and Qm_n and the signal generated by the OR operation on inverted Qm_n and Qm_n have the same periods and opposite phases.

In conclusion, the frequency division circuit of the present invention generates reference clocks with different phases for triggering the state machines to generate intermediate signals. Then the required output clock is generated by performing logic operations on each intermediate signal. Compared with the prior art, the present invention not only generates the output clock by the phase-locked circuit, but also provides at least an output clock by a non-integer frequency circuit. The present invention provides output clocks (especially clocks with non-integer frequencies) by simple logic circuits (such as flip-flops, logic gates). This saves the size of layout and power consumption, simplifies the circuit structure, and satisfies the requirements of multiple-clock systems. The size of the present invention layout is about one-fifth the size of the general phase-locked circuit. The output clocks generated by the present invention are suitable to trigger the circuits that are triggered by rising edge or falling edge.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for performing non-integer frequency division, providing at least an output clock according to a plurality of reference clocks, and making the period of the output clock a predetermined multiple of the period of the reference clocks, the method comprising:

receiving a plurality of reference clocks, the periods of the reference clocks being the same, and the phases between the different reference clocks being different;

triggering a plurality of intermediate signals according to each period of the reference clocks, there being M intermediate signals for each reference clock, and making the minimum period of the intermediate signals M times the period of the corresponding reference clock, the phases between the intermediate signals corresponding to the same reference clock being different; and performing a logic operation between at least two intermediate signals respectively corresponding to two different reference clocks, providing an output clock according to the result of the logic operation, the minimum period of the output clock being shorter than the period of the intermediate signals.

2. The method of claim 1 wherein when receiving N reference clocks each identified by an integer n ranging from one to N, the phase difference between the n-th reference clock and the first reference clock is $((n-1)/N)*360$ degrees.

3. The method of claim 2 wherein when the period of the reference clock is T, the period of the output clock is $L*(T/N)$, L being one of the factors of $M*N$.

4. The method of claim 1 wherein each of M intermediate signals is identified by an integer m ranging from one to M and the phase difference between the m-th intermediate signal and the first intermediate signal is equal to m times the period of the reference clock.

5. The method of claim 1 wherein the period of each intermediate signal kept at a first level is an integer multiple of the period of the reference clock.

6. The method of claim 1 wherein when performing the triggering step, the plurality of the intermediate signals is generated by edge-triggering.

7. The method of claim 1 wherein the period of the output clock is shorter than the period of the reference clocks.

8. A signal circuit for providing at least one output clock according to a plurality of reference clocks, making the period of the output clock a predetermined multiple of the period of the reference clocks, the signal circuit comprising:

a reference clock circuit for providing a plurality of reference clocks, the periods of reference clocks being the same, and the phases between the different reference clocks being different;

a triggering module including a plurality of state machines, each state machine corresponding to a reference clock, for triggering a plurality of corresponding intermediate signals according to each period of the reference clocks, there being M intermediate signals for each reference clock, and for making the minimum period of the intermediate signals M times the period of the corresponding reference clock, the phases between the intermediate signals corresponding to the same reference clock being different; and a logic module including a plurality of logic gates, the logic module performing a logic operation between at least two intermediate signals respectively corresponding to two different reference clocks, providing an output clock according to the result of the logic operation, the minimum period of the output clock being shorter than the period of the intermediate signals.

9. The signal circuit of claim 8 wherein the reference clock circuit provides N reference clocks each identified by an integer n ranging from one to N, the phase difference between the n-th reference clock and the first reference clock being $((n-1)/N)*360$ degrees.

10. The signal circuit of claim 9 wherein when the period of the reference clocks is T, the period of the output clock is $L*(T/N)$, L being one of the factors of $M*N$.

11. The signal circuit of claim 8 wherein each of M intermediate signals is identified by an integer m ranging from one to M and the phase difference between the m-th intermediate signal and the first intermediate signal is equal to m times the period of the reference clocks.

12. The signal circuit of claim 8 wherein the period of each intermediate signal kept at a first level by each state machine is an integer multiple of the period of the reference clock.

13. The signal circuit of claim 8 wherein each state machine generates the plurality of the intermediate signals by edge-triggering.

14. The signal circuit of claim 8 wherein the period of the output clock generated by the logic module is shorter than the period of the reference clocks.

* * * * *